(12) United States Patent
Hossain et al.

(10) Patent No.: US 9,947,815 B2
(45) Date of Patent: *Apr. 17, 2018

(54) THIN FILM PLASMONIC SOLAR CELL

(71) Applicant: King Fahd University of Petroleum and Minerals, Dhahran (SA)

(72) Inventors: Mohammad Kamal Hossain, Dhahran (SA); Qasem Ahmed Qasem, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 15/679,819

(22) Filed: Aug. 17, 2017

(65) Prior Publication Data

US 2018/0026146 A1 Jan. 25, 2018

Related U.S. Application Data

(63) Continuation of application No. 15/009,338, filed on Jan. 28, 2016, now Pat. No. 9,773,931.

(Continued)

(51) Int. Cl.
*H01L 31/0236* (2006.01)
*H01L 31/0232* (2014.01)
(Continued)

(52) U.S. Cl.
CPC .......... *H01L 31/02366* (2013.01); *C22F 1/14* (2013.01); *C23C 14/14* (2013.01);
(Continued)

(58) Field of Classification Search
CPC combination set(s) only.
See application file for complete search history.

(56) References Cited

U.S. PATENT DOCUMENTS

2013/0081693 A1* 4/2013 Kaufman ............... G02B 5/008
136/257
2013/0168228 A1 7/2013 Ozin

FOREIGN PATENT DOCUMENTS

KR 2014/118263 A 10/2014
WO WO 2014/062135 A1 4/2014

OTHER PUBLICATIONS

MK.Hossain et al., "Silver nanoparticles on Zinc Oxide thin film: An insight in fabrication and characterization" $2^{nd}$ International Conference on Structural Nano Composites, 2014, pp. 1-7.

(Continued)

*Primary Examiner* — Nathan L Van Sell
(74) *Attorney, Agent, or Firm* — Oblon, McClelland, Maier & Neustadt, L.L.P.

(57) ABSTRACT

A plasmonic scattering nanomaterial comprising a substrate layer, a metal oxide layer in continuous contact with the substrate layer and silver nanoparticles with a diameter of 25-300 nm deposited on the metal oxide layer is disclosed. The silver nanoparticles have a broad size distribution and interparticle distances such that the silver nanoparticles plasmonically scatter light throughout the metal oxide layer with a near electric field strength of 1-30 V/m when excited by a light source having a wavelength in the range of 300-500 nm and/or 1000-1200 nm. In addition, a method for producing the nanomaterial by sputter deposition is disclosed as well as an appropriate thin film plasmonic solar cell comprising the nanomaterial with a solar efficiency of at least 10%.

16 Claims, 19 Drawing Sheets

Related U.S. Application Data

(60) Provisional application No. 62/164,403, filed on May 20, 2015.

(51) Int. Cl.
  *C23C 14/34* (2006.01)
  *C23C 14/58* (2006.01)
  *C23C 14/14* (2006.01)
  *C22F 1/14* (2006.01)

(52) U.S. Cl.
  CPC ...... *C23C 14/3407* (2013.01); *C23C 14/5806* (2013.01); *H01L 31/02327* (2013.01)

(56) References Cited

OTHER PUBLICATIONS

Tan et al, Jun. 27, 2012, Plasmonic Light Trapping in Thin-film Silicon Solar Cells with Improved Self-Assembled Silver Nanoparticles, NanoLetters, American Chemical Society.
Hossain et al, Jun. 2014, Silver Nanoparticles on Zinc Oxide: An Approach to Plasmonic PV Solar Cell, Advanced Materials Research, vol. 938, pp. 280-285.

* cited by examiner

THIN FILM PLASMONIC SOLAR CELL

CROSS REFERENCE TO RELATED APPLICATIONS

This application is a continuation of Ser. No. 15/009,338, now allowed, which claims priority to U.S. Provisional Application No. 62/164,403, having a filing date of May 20, 2015.

BACKGROUND OF THE INVENTION

Technical Field

The present disclosure relates to a plasmonic scattering nanomaterial comprising a substrate layer, a metal oxide layer and silver nanoparticles. The present disclosure further relates to a method for producing the nanomaterial. Additionally, the present disclosure relates to an application of the plasmonic scattering nanomaterial as a component of a thin film plasmonic solar cell.

Description of the Related Art

The "background" description provided herein is for the purpose of generally presenting the contest of the disclosure. Work of the presently named inventors, to the extent it is described in this background section, as well as aspects of the description which may not otherwise qualify as prior an at the time of filing, are neither expressly or impliedly admitted as prior art against the present invention.

Thin film solar cells have the potential to significantly decrease the cost of photovoltaic solar driven electric power generation. But unfortunately so far none of the technology has been able to challenge the supremacy of bulk crystalline silicon based cells, which possess a number of advantages such as high performance, stability, abundance in nature and non-toxicity. To achieve large scale implementation, the light harvesting efficiency must be further improved, especially through better light management. In conventional silicon (Si) based solar cells, surface texturing is considered for this purpose [U. Kreibig, M. Vollmer, *Optical properties of metal clusters*, Springer-Verlag, Berlin, 1995; and E. Yablonovitch, G. D. Cody, Intensity enhancement in textured optical, sheets for solar cells, *IEEE Trans. Electr. Dev.* 29:300-305, 1982; and H. W. Deckman, C. B, Roxlo, E. Yablonovitch, Maximum statistical increase of optical absorption in textured semiconductor films. *Opt. Lett.* 8:491-493, 1983.—each incorporated herein by reference in its entirety]. Such geometries are not suitable for thin film cells because of geometrical constraints as well as the higher carrier recombination that occurs in the larger surfaces as well as at junctions.

An exciting way of achieving efficient light management in thin film solar cells is to introduce plasmonic nanoparticles and/or nanostructures that support surface plasmons defined as excitations of the conduction electrons at the interface between a metal and dielectric or at the surface of the nanoparticles and/or nanostructures. Until recently studies have focused on the increase of absorption in thin film solar cells through the surface plasmon effect [B. Rech, H. Wagner, Potential of amorphous silicon for solar cells, *App. Phys. A* 69:155-167, 1999; and D. S. Shen, H, Chatham, P. K. Bhat, High-deposition-rate amorphous silicon solar cells: Silane or Disilane?, *Solar Cells* 30:271-275, 1991; and H. A. Atwater, A. Polman, Plasmonics for improved photovoltaic, devices, *Nat. Mat.* 9:205-213, 2010; and M. K. Hossain, Y. Kitahama, G. G. Huang, T, Kaneko, Y. Ozaki, SPR and SERS characteristics of gold nanoaggregates with different morphologies, *App. Phys. B* 93; 165-170, 2008.—each incorporated herein by reference in its entirety]. Gold, silver or copper nanoparticles, ranging from 10 to 120 rail have been deposited by different techniques such as, wet processes or thermal evaporation followed by a heat treatment to generate, islands. However, even if an increase in short circuit current has been demonstrated ail of the works have underlined the necessity to improve the control of the nanoparticle properties (i.e., size, shape, surface density) to enhance solar absorption and to tune the plasmon resonance to a given wavelength range.

Plasmonics can offer at least three ways to enhance the efficiency: (i) as a subwavelength scattering element to couple and trap free plane waves into absorption layers [K. Imura, H. Okamoto, M. K. Hossain, M. Kitajima, Visualization of localized intense optical fields in single gold-nanoparticle assemblies and ultrasensitive Raman active sites, *Nana Lett.* 6:2173-2176, 2006; and K. R. Catchpole, A. Polman, Plasmonic solar cells, *Opt. Express* 16:21793-21800, 2008; and O. L, Muskens, J. G. Rivas, R. E. Algra, E. P. A. M. Bakkers, A. Lagendijk, Design of light scattering in nanowire materials for photovoltaic applications. *Nano Lett.* 8:2638-2642, 2008.—each incorporated herein by reference in its entirety], (ii) as an inducer of polariton modes that confine and guide the light in the absorption layer [M. K. Hossain, Y. Kitahama, V. P. Biju, T. Kaneko, T. Itoh, Y. Ozaki, Surface plasmon excitation and surface-enhanced Raman scattering using two-dimensionally close-packed gold nanoparticles, *J. Phys. Chem. C* 13; 11689-11694, 2009; and M. K. Hossain, T. Shimada, M. Kitajima, K. Imura, H. Okamoto, Near-field Raman imaging and electromagnetic field confinement m the self-assembled monolayer array of gold nanoparticles, *Langmuir* 24:9241-9244, 2008; and M. K. Hossain, T. Shimada, M. Kitajima, K. Imura H. Okamoto, Raman and near-field spectroscopic study on localized surface plasmon excitation from the 2D nanostructure of gold nanoparticles, *J. Microsc.* 229:327-330, 2008.—each incorporated herein by reference in its entirety], and (iii) as an antenna that stores incident energy resulting in enhanced photocurrent.

A representative configuration is shown in FIG. 1. Typically the plasmonic structure is embedded in an active layer, such as silicon (Si), an intrinsic conductor and therefore, the plasmonic properties will be used to contribute to exciton generation. A recent concern has been designing and fabricating such geometries with hands-on techniques that can offer all of these benefits to achieve ultimate efficiency comparable to crystalline silicon solar cells [V. E. Ferry, J. N. Munday, H. A. Atwater, Design considerations for plasmonic photovoltaics, *Adv. Mater.* 22:4794-4808, 2010; and K. Nakayama, K, Tanabe, H. A. Atwater, Plasmonic nanoparticle enhanced light absorption in GaAs solar cells, *Appl Phys. Lett,* 93; 121904-1-121904-3, 2008; and C. F. Bohren, D. R Huffman, Absorption and scattering of light by small particles (Wiley, 2008); and J. Mertz, Radiative absorption, fluorescence, and scattering of a classical dipole near a lossless interface: a unified, description. *J. Opt. Soc. Am. B,* 17:1906-1913, 2000; and D. Derkacs, W. V. Chen, P. M. Matheu. S. H. Lim, P. K. L. Yu, E. T. Yu, Nanoparticle-induced light scattering for improved performance of quantum-well solar cells, *Appl. Phys. Lett.* 93:091107-1-091107-3, 2008.—each incorporated herein by reference in its entirety]. Since the plasmonic structures involved in such cases are an integral part of the complete solar cell, it is preferable to include post-processes as little as possible. Any modification in plasmonic structures will affect other layers and thus the entire performance of the cell will need to be revisited. A tunable and suitable plasmonic characteristic of such structures is desired beforehand. Cost effective and large scale fabrication as well as industrial production capabilities of such solar cells is a key factor in minimizing cost per kW. Although several issues such as interfaces enriched with carrier recombination, complicated processes to achieve plasmonic structures, etc. are inevitable, there is always room to improve the current technology. Nanoscience and nanotechnology based understanding has paved the way for solar cell research by leaps and bounds already.

In view of the forgoing, one object of fee present disclosure is to provide silver nanoparticles on metal oxide for consideration as a plasmonic scattering nanomaterial suitable for plasmonic photovoltaic solar cells. A further aim of the present disclosure is to provide a simple two-step and hands-on method for fabricating the nanomaterial. A further aim of the present disclosure is to provide a thin film plasmonic solar cell comprising the nanomaterial. The contributions of silver nanoparticles to plasmonic solar cells and an understanding of their beneficial characteristics as well as the simple fabrication method are indispensable to moving plasmonic solar cells forward to meet the challenges of the solar cell market.

BRIEF SUMMARY OF THE INVENTION

According to a first aspect, the present disclosure relates to a plasmonic scattering nanomaterial comprising i) a substrate layer ii) a metal oxide layer in continuous contact with the substrate layer and ii) silver nanoparticles with a diameter of 25-300 nm deposited on the metal oxide layer wherein the silver nanoparticles plasmonically scatter light throughout the metal oxide layer when excited by light having a wavelength in the range of 300-500 nm or 1000-1200 nm and wherein the silver nanoparticles have a near electric field strength of 1-30 V/m when excited by light having a wavelength in the range of 300-500 nm or 1000-1200 nm.

In one embodiment, the metal oxide layer is zinc oxide.

In one embodiment, the substrate is glass.

In one embodiment, the plasmonic scattering nanomaterial comprises $2.0 \times 10^7$ to $2.0 \times 10^9$ silver nanoparticles per $cm^2$ of the metal oxide layer.

In one embodiment, the silver nanoparticles have an average center to center distance of greater than 100 nm.

In one embodiment, the silver nanoparticles have a broad particle size distribution having a relative standard deviation of greater than 5%.

In one embodiment, the silver nanoparticles have a diameter in the range of about 25-100 nm and a near electric field strength of 20-30 V/m when excited by light having a wavelength, of 300-500 nm.

In one embodiment, the silver nanoparticles have a diameter in the range of about 100-300 nm and a near electric field strength of 5-10 V/m when excited by light having a wavelength of 300-500 nm.

In one embodiment, the silver nanoparticles have a near electric field strength of 1-5 V/m when excited by light having a wavelength of 1000-1200 nm.

In one embodiment, the silver nanoparticles have a diameter in the range of about 25-100 nm and have an electric flux distribution of up to 40 nm when excited by light having a wavelength of 300-500 nm or 1000-1200 nm.

In one embodiment, the silver nanoparticles have a diameter in the range of about 100-300 nm and have an electric flux distribution of greater than 50 nm when excited by light having a wavelength of 300-500 nm or 1000-1200 nm.

In one embodiment, the plasmonic scattering nanomaterial further comprises nanoparticles comprising at least one additional plasmonic metal selected from the group consisting of gold, copper, aluminum, platinum and palladium and alloys thereof.

In one embodiment, the plasmonic scattering nanomaterial is substantially free of surfactants, ligands, capping reagents, binders and/or linkers.

According to a second aspect the present disclosure relates to a method for producing the plasmonic scattering nanomaterial comprising i) depositing the metal oxide layer on fee substrate ii) sputtering silver atop the metal oxide layer and iii) annealing the substrate, the metal oxide layer and the silver to form the plasmonic scattering nanomaterial wherein the silver nanoparticles are formed from the silver atop the metal oxide layer during the annealing.

In one embodiment, the annealing is performed at a temperature in the range of 150-750° C.

In one embodiment, the average silver nanoparticle size increases as the temperature at which the annealing is performed increases.

In one embodiment, a density of silver nanoparticles atop the metal oxide layer decreases as the temperature at which the annealing is performed increases.

According to a third aspect, the present disclosure relates to a thin film plasmonic solar cell comprising the plasmonic scattering nanomaterial wherein the thin film plasmonic solar cell has an average thickness of less than 20 μm and wherein the plasmonically scatter light excites conduction electrons of the substrate layer and metal oxide layer and increases absorption of solar light by the thin film plasmonic solar cell.

In one embodiment, the thin film plasmonic solar cell has an absorption depth profile of up to 2 μm.

In one embodiment, the thin film plasmonic solar cell has a solar cell efficiency ($\eta$) of at least 10%.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
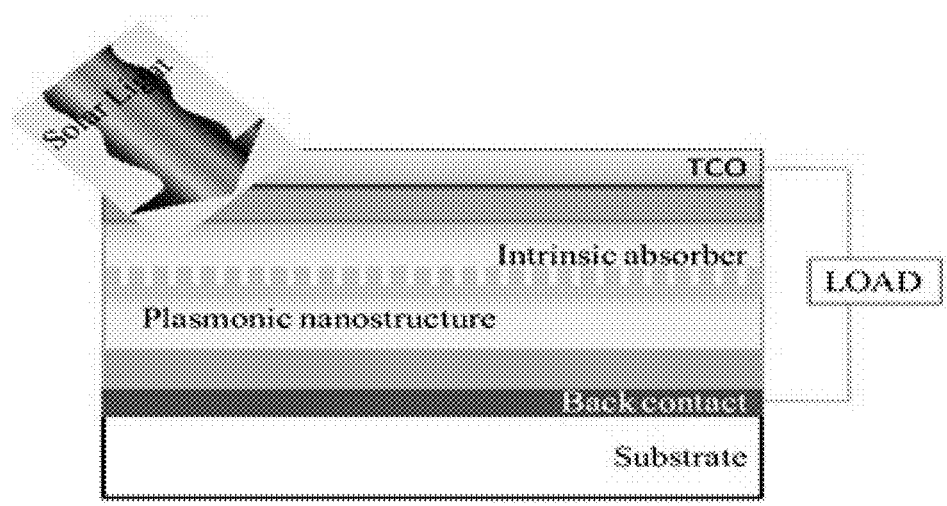
FIG. 1 is a schematic diagram of a possible configuration including the basic requirements of a thin film plasmonic solar cell.

Referring now to the drawings, wherein, like reference numerals designate identical or corresponding parts throughout the several views.

According to a first aspect, the present disclosure relates to a plasmonic scattering nanomaterial comprising i) a substrate layer, ii) a metal oxide layer in continuous contact with the substrate layer and iii) silver nanoparticles with an average particle diameter of 25-300 nm deposited on the metal oxide layer wherein the silver nanoparticles plasmonically scatter light throughout the metal oxide layer when excited by light having a wavelength in the range of 300-500 nm or 1000-1200 nm, and wherein the silver nanoparticles have a near electric field strength of 1-30 V/m when excited, by light having a wavelength in the range of 300-500 nm or 1000-1200 nm.

The plasmonic scattering nanomaterial of the present disclosure comprises a substrate layer. The nature of this layer is not viewed as particularly limiting and any suitable material of varying size, shape, and texture (i.e. smooth, porous, roughened, corrugative and/or etched) may be envisioned that provides suitable plasmonic nanoscattering. Exemplary materials for the substrate layer include, but are not limited to, glass, silicon, plastic and steel and mixtures thereof. In a preferred embodiment, the substrate layer of the plasmonic scattering nanomaterial of the present disclosure is glass, preferably quartz. The plasmonic scattering nanomaterial of the present disclosure further comprises a metal oxide semiconducting layer in continuous contact with the substrate layer and silver nanoparticles deposited on the metal oxide layer. The substrate layer in continuous contact with the metal oxide layer with silver nanoparticles deposited on the metal oxide layer is referred to herein as the "plasmonic scattering nanomaterial", "active nanomaterial" or "Nanomaterial".

In a preferred embodiment, the plasmonic scattering nanomaterial is generally flat, it is equally envisaged that the nanomaterial may be curved, bent, conical, serpentine, tubular, rigid and/or flexible as it comprises thin and ultra-thin films on a substrate. In one embodiment the substrate may determine the overall shape of the nanomaterial and the shape may include panels or a variety of light trapping geometries depending on the intended application of the plasmonic scattering nanomaterial. In a preferred embodiment, the metal oxide layer is at least as thick as the silver nanoparticles (i.e. ~100 nm), preferably at least one and a half times as thick, preferably at least two times as thick, preferably at least three times, preferably at least four times, preferably at least five times, preferably at least ten times as thick as the silver nanoparticles. In another embodiment, the substrate layer is at least five times as thick as the metal oxide layer, preferably at least ten times, preferably at least fifteen times, preferably at least twenty times, preferably at least twenty live times as thick as the metal oxide layer.

In a preferred embodiment, the metal oxide layer is a semiconductive or conductive metal oxide layer, preferably zinc oxide. In addition to zinc oxide, it is envisaged that the present disclosure may be adapted to incorporate other metal oxides as part of the metal oxide layer of the plasmonic scattering nanomaterial, preferably with semiconducting characteristics. Exemplary metal oxides need only be generally of low cost. Examples of suitable metal oxides include, but are not limited to, oxides of aluminum, iron, copper, nickel, magnesium, zirconium, titanium, vanadium, rhodium, rhenium, silicon, molybdenum, thorium, chromium, manganese, cerium, silver, lead, cadmium, calcium, antimony, tin, bismuth, cobalt, tungsten and alloys or mixtures thereof. In another embodiment, the metal oxide layer may comprise a transparent conductive oxide including, but not limited to, indium tin oxide (ITO), fluorine doped tin oxide (FTO), aluminum doped zinc oxide, delafossite type transparent conducting oxides, mayenite type transparent conducting oxides, lithium doped nickel oxide, sodium doped zinc oxide and the like and mixtures thereof.

In a preferred embodiment, the metal oxide layer of the plasmonic scattering nanomaterial of the present disclosure is zinc oxide. Zinc oxide is an inorganic compound with the formula ZnO. ZnO is a white powder that is insoluble in water and widely used as an additive in numerous materials and products. It occurs naturally as the mineral zincite, but most zinc oxide is produced synthetically. ZnO is a wide bandgap semiconductor of the II-VI semiconductor group. The native doping of the semiconductor due to oxygen vacancies or zinc interstitials is n-type. As a semiconductor ZnO has several favorable properties including good transparency, high electron mobility, wide bandgap, and strong room temperature luminescence. Zinc oxide crystallizes in two main forms, hexagonal wurzite and cubic zincblende. The wurzite structure is most stable at ambient conditions and thus most common. In both cases, the nm and oxide centers are tetrahedral, the most characteristic geometry for Zn (II). Hexagonal and zincblende polymorphs have no inversion symmetry. This and additional lattice symmetry properties result in piezoelectricity of the hexagonal and zincblende ZnO, and pyroelectricity of hexagonal ZnO. In terms of die present disclosure, zinc oxide may refer to ZnO having a hexagonal wurtzite crystal structure, a cubic zincblende crystal structure or mixtures thereof.

Silver (Ag) is a soft, white and lustrous transition metal having a face centered cubic crystal structure that possesses the highest electrical conductivity, thermal conductivity and reflectivity of any metal. The metal occurs naturally in its pure, free form (native silver), as an alloy with gold and other metals, and in minerals such as argentite and chlorargyrite. Most silver is produced as a byproduct of copper, gold, lead and zinc refining. Naturally occurring silver is composed of two stable isotopes $^{107}$Ag and $^{109}$Ag with almost equal, abundance. Silver nanoparticles refer to nanoparticles of silver of between 1-500 nm in size. Although frequently described as silver, they may be comprised of a large percentage of silver oxide due to their large ratio of surface to bulk silver atoms.

In a preferred embodiment, the silver nanoparticles of the present disclosure substantially comprise elemental silver. The term "silver nanoparticle" as used herein refers to an elemental silver rich material (i.e. greater than 50%, more preferably greater than 60%, more preferably greater than 70%, more preferably greater than 75%, more preferably greater than 80%, more preferably greater than 85%, more preferably greater than 90%, more preferably greater than 95%, more preferably greater than 99% elemental silver by weight), which is deposited onto the metal oxide layer.

In addition to elemental silver, various non-elemental silver materials including, but not limited to, silver alloys, metals and non-metals may be present in the silver nanoparticle. The total weight of these non-elemental silver materials relative to the total weight percentage of the silver nanoparticles is typically less than 30%, preferably less than 20%, preferably less than 15%, preferably less than 10%, more preferably less than 5%, more preferably less than 4%, more preferably less than 3%, more preferably less than 2%, more preferably less than 1%.

In addition to silver, it is envisaged that the present disclosure may be adapted to incorporate or comprise at least one additional plasmonic scattering metal (capable of surface plasmon resonance under light from 200-1100 nm) selected from the group consisting of gold, copper, aluminum, platinum and palladium and alloys or mixtures thereof. These metals may be in the form of nanoparticles and may be randomly or non-randomly arranged as well as equally dispersed or unevenly dispersed amongst the silver nanoparticles of the present disclosure or in some embodiments fully substituted for the silver nanoparticles of the present disclosure. In a preferred embodiment, less than 60% of the nanoparticles are an additional plasmonic scattering metal, preferably less than 50%, preferably less than 40%, preferably less than 30%, preferably less than 25%, preferably less than 20%, preferably less than 15%, preferably less than 10%, preferably less than 5% of the nanoparticles are an additional plasmonic scattering metal. In a preferred embodiment, the nanoparticles of an additional plasmonic scattering metal would be generally subject to the same shape and size conditions of the silver nanoparticles described herein.

The silver nanoparticles and the metal oxide layer, as well as the metal oxide layer and the substrate layer may be attached to one another in any reasonable manner, preferably by highly connected or integral interactions (e.g. melted together, fused, amalgamated, annealed, etc.). In another embodiment, the layers may be attached by adsorption defined as the adhesion of atom, ions or molecules to a surface creating a film metal oxide layer immobilized on the glass substrate layer and a film of silver nanoparticles deposited on the metal oxide layer. The attachment may refer to adsorption and/or chemical binding via strong atomic bonds (e.g. ionic, metallic and covalent bonds) and/or weak bonds (e.g. van der Waals forces or hydrogen binding). In one embodiment, the metal oxide layer is physisorbed onto the glass layer and the silver nanoparticles are physisorbed onto and/or within the metal oxide layer, leaving the chemical species of both materials intact. In a preferred embodiment, the plasmonic scattering nanomaterial of the present disclosure is substantially free of surfactants, ligands, capping reagents, binders and/or linkers and surface coatings that are often used to aid the immobilization or deposition of plasmonic scattering nanoparticles to substrate. For photovoltaic applications, nanoparticles need to be pure and free of residual surfactants, ligands, capping reagents, binders and/or linkers which might create possible exciton traps that are to be avoided.

In one embodiment, the silver nanoparticles may be deposited on the metal oxide layer or embedded in the metal oxide layer. The silver nanoparticles may be affixed or deposited inside of and/or on an outer surface of the metal oxide layer. The silver nanoparticles may be affixed to the metal oxide layer in any reasonable manner, such as affixed to one or more surfaces of the metal oxide layer or alternately, at least partially embedded within the metal oxide layer and/or additional void or pore spaces. In a preferred embodiment, the silver nanoparticles only contact the metal oxide layer and do not contact the substrate. In another embodiment, direct contact between the silver nanoparticles and the substrate is envisaged but is preferably minimized.

In one embodiment, from 10-90% of the total volume and/or surface area of the silver nanoparticle is embedded within the metal oxide layer, preferably 10-80%, preferably 10-60%, preferably 10-40%, preferably 15-30%. In one embodiment, greater than 10% of the surface area (i.e. surface and pore spaces) of the metal oxide layer is covered by silver nanoparticles, preferably greater than 15%, preferably greater than 20%, preferably greater than 25%, preferably greater than 30%, preferably greater than 3.5%, preferably greater than 40%, preferably greater than 45%, preferably greater than 50%, preferably greater than 55%, preferably greater than 60%, preferably greater than 65%, preferably greater than 70%, preferably great than 75% of the surface area of the metal oxide layer is covered by silver nanoparticles.

Nanoparticles are particles between 1 and 100 nm ($10^2$ and $10^7$ atoms) in size. A particle is defined as a small object that behaves as a whole unit with respect to its transport and properties. The exceptionally high surface area to volume ratio of nanoparticles may cause the nanoparticles to exhibit significantly different or even novel properties from those observed in individual atoms/molecules, fine particles and/or bulk materials. Nanoparticles may be classified according to their dimensions. Three-dimensional nanoparticles have all dimensions of less than 100 nm, and generally encompass isodimensional nanoparticles. Examples of three-dimensional nanoparticles include, but are not limited to, nanoparticles, nanospheres, nanogranules and nanobeads. Two-dimensional nanoparticles have two dimensions of less than 100 nm, generally including diameter. Examples of two-dimensional nanoparticles include, but are not limited to, nanotubes, nanofibers and nanowhiskers. One-dimensional nanoparticles have one dimension of less than 100 nm, generally thickness. Examples of one-dimensional nanoparticles include, but are not limited to, nanosheets, nanoplatelets, nanolaminas and nanoshells. The silver nanoparticles of the present disclosure are preferably three-dimensional nanoparticles, but may also be one-dimensional, two-dimensional, three-dimensional or mixtures thereof.

Nanoparticles are named for the real-world shapes that they appear to represent. These morphologies sometimes arise spontaneously as an effect of the synthesis or from the innate crystallographic growth patterns of the materials themselves. Some of these morphologies may serve a purpose, such as bridging an electrical junction. In a preferred embodiment, the silver nanoparticles of the present disclosure are in the form of a nanoparticle, which is spherical or substantially spherical (e.g. oval, oblong, etc.) in shape. Alternatively, it is envisaged that the gold nanoparticles may have a more polygonal shape and may be generally cubic or rectangular. However, the silver nanoparticles disclosed herein may have various shapes other than spheres and may be of any shape that provides desired plasmonic scattering, activity and/or desired properties in the resulting nanomaterial. In a preferred embodiment, the silver nanoparticles have a spherical morphology.

In one embodiment, the silver nanoparticles of the present disclosure are envisioned to be synthesized and formed into a variety of morphologies including, but not limited to, nanoparticles, nanosheets, nanoplatelets, nanocrystals, nanospheres, nanorectangles, nanotriangles, nanopentagons, nanohexagons, nanoprisms, nanodisks, nanocubes, nanowires, nanofibers, nanoribbons, nanorods, nanotubes, nanocylinders, nanogranules, nanowhiskers, nanoflakes, nanofoils, nanopowders, nanoboxes, nanostars, tetrapods, nanobelts, nanourchins, nanoflowers, etc. and mixtures thereof.

In one embodiment, the silver nanoparticles have uniform shape. Alternatively, the shape may be non-uniform. As used herein, the term "uniform" refers to an average consistent shape that differs by no more than 10%, by no more than 5%, by no more than 4%, by no more than 3%, by no more than 2%, by no more than 1% of the distribution of silver nanoparticles having a different shape. As used herein, the term "non-uniform" refers to an average consistent shape that differs by more than 10% of the distribution of silver nanoparticles having a different shape. In one embodiment, the shape is uniform and at least 90% of the silver nanoparticles are spherical or substantially circular, and less than 10% are polygonal or substantially square. In another embodiment, the shape is non-uniform and less than 90% of the silver nanoparticles are spherical or substantially circular, and greater than 10% are polygonal or substantially square.

Nanoparticle characterization may be used to establish understanding and control of nanoparticle and nanomaterial synthesis, assembly and application. In one embodiment, it is envisioned that characterization is done using a variety of techniques. Exemplary techniques include, but are not limited to, electron microscopy (TEM, SEM), atomic force microscopy (AFM), ultraviolet-visible spectroscopy (UV-Vis), dynamic light scattering (DLS), X-ray photoelectron spectroscopy (XPS), X-ray fluorescence (XRF), powder X-ray diffraction (XRD), energy dispersive X-ray spectroscopy (EDX), thermogravimetric analysis (TGA), Fourier transform infrared spectroscopy (FTIR), matrix-assisted laser desorption/ionization time-of-flight mass spectrometry (MALDI-TOF), Rutherford backscattering spectrometry (RBS), dual polarization interferometry and nuclear magnetic resonance or mixtures thereof.

The size of the silver nanoparticles may also dictate the level of plasmonic scattering of the nanomaterial described herein. For spherical or substantially spherical silver nanoparticles, average particle size refers to the average longest linear diameter of the silver nanoparticles. For non-spherical silver nanoparticles, such as cubes, squares and/or rectangles the average particle size may refer to the longest linear dimension and any of the length, width or height. In a preferred embodiment, the silver nanoparticles of the present disclosure have an average particle size of 25-300 nm, preferably 25-250 nm, preferably 50-250 nm, preferably 50-200 nm in diameter. In another embodiment, the silver nanoparticles of the present disclosure may have an average particle size of 1-500 nm, preferably 1-400 nm, preferably 1-300 nm, preferably 5-275 nm, preferably 25-250 nm, preferably 50-200 nm. The average particle size may vary from these ranges and still provide an acceptable plasmonic scattering nanomaterial.

In a preferred embodiment, the silver nanoparticles of the present disclosure are not monodisperse having a broad particle size distribution and having a coefficient of variation or relative standard deviation, expressed as a percentage and defined as the ratio of the particle size standard deviation ($\sigma$) to the particle size mean ($\mu$) multiplied by 100 of greater than 5%, preferably greater than 6%, preferably greater than 7%, preferably greater than 8% preferably greater than 9%, preferably greater than 10%, preferably greater than 12%, preferably greater than 15%, preferably greater than 18%, preferably greater than 20%. In another embodiment, the present disclosure may be adapted to comprise silver nanoparticles that may be more monodisperse and have a relative standard deviation of less than 20%, preferably less than 15%, preferably less than 10%, preferably less than 5% in a preferred embodiment, the silver nanoparticles of the present disclosure have a broad particle size distribution ranging from 20% of the average particle size to 500% of the average particle size, preferably 30% to 400%, preferably 40% to 300%, preferably 50% to 250% of the average particle size. In another embodiment, the present disclosure may be adapted to comprise silver nanoparticles that may be more monodisperse and have a smaller particle size distribution of 80% of the average panicle size to 120% of the average particle size, preferably 90% to 110% of the average particle size.

In a preferred embodiment, the silver nanoparticles are substantially discrete and separated by center to center interparticle distances of greater than 100 nm, preferably greater than 125 nm, preferably greater than 150 nm, preferably greater than 175 nm, preferably greater than 200 nm, preferably greater than 250 nm, preferably greater than 300 nm, preferably greater than 400 nm, preferably greater than 500 nm. The center to center interparticle distance refers to the shortest distance between the centers of two neighboring silver nanoparticles. The properties of silver nanoparticles may change when particles aggregate and these interparticle distances provide optimal plasmonic scattering in the nanomaterial. In a preferred embodiment, the silver nanoparticles of the present disclosure have an average surface to surface interparticle distance of greater than 50% of their average particle size, preferably greater than 75%, preferably greater than 100%, preferably greater than 125%, preferably greater than 150%, preferably greater than 175%, preferably greater than 200%, preferably greater than 250%, preferably greater than 300%, preferably greater than 400%, preferably greater than 500% of their average particle size. The surface to surface interparticle distance refers to the shortest distance between the outer edges of two neighboring silver nanoparticles.

In addition to a wide size distribution and disperse morphology the coverage of silver nanoparticles may affect the plasmonic scattering of the nanomaterial. In a preferred embodiment, the coverage of the silver nanoparticles is in the range of $2 \times 10^7$ to $2 \times 10^9$ silver nanoparticles per $cm^2$ of the metal oxide layer, preferably $3 \times 10^7$ to $1.5 \times 10^9$, preferably $5 \times 10^7$ to $1.4 \times 10^9$, preferably $1 \times 10^8$ to $1.3 \times 10^9$, preferably $1.5 \times 10^8$ to $1 \times 10^9$, preferably $2.5 \times 10^8$ to $7.5 \times 10^8$ silver nanoparticles per $cm^2$ of the metal oxide layer.

Plasmonic nanoparticles are particles whose electron density can couple with electromagnetic radiation of wavelengths that are far larger than the particle due to the nature of the dielectric metal, interface between the medium and the particles, counter to a pure metal where there is a maximum limit on what size wavelength can be effectively coupled based on the material size. Differentiating plasmonic nanoparticles from traditional surface plasmons is that plasmonic nanoparticles also exhibit interesting scattering, absorbance and coupling properties based on their geometries and relative positions. Plasmons are the oscillations of free electrons that are the consequence of the formation of a dipole in the material due to electromagnetic waves. The electrons migrate in the material to restore its initial state; however, the light waves oscillate, leading to a constant shift in the dipole that forces the electrons to oscillate at the same frequency as the light. This coupling only occurs when the frequency of the light is equal to or less than the plasma frequency and is greatest at the plasma frequency that is therefore called the resonant frequency. The scattering and absorbance cross sections describe the intensity of a given frequency to be scattered or absorbed. As it relates to plasmonic solar cells, the ability of these nanoparticles to scatter light back into the photovoltaic structure and their low absorption make them advantageous for increasing solar cell efficiency and by forcing more light to be absorbed by the dielectric.

Thus one object of the present disclosure is to provide tunable size and geometry nanoparticles, nanomaterials, and fabrication processes to maximize these properties. Plasmons can be excited by optical radiation and induce an electric current from hot electrons in materials fabricated comprising these nanoparticles (i.e. silver nanoparticles). The wavelength to which the plasmon responds and the current it generates is a function of the size and spacing of the nanoparticles. In a preferred embodiment, the silver nanoparticles of 25-300 nm in diameter of the plasmonic scattering nanomaterial of the present disclosure plasmonically scatter light throughout the metal oxide layer when excited by a light source having a wavelength in the range of 300-500 nm or 1000-1200 nm and the silver nanoparticles have a near electric field strength of 1-30 V/m when excited by light having a wavelength in the range of 300-500 nm or 1000-1200 nm. In a general preferred embodiment, smaller silver nanoparticles have a larger near electric field strength balanced with a smaller electric flux distribution and larger silver nanoparticles have a smaller near electric field strength balanced with a larger electric flux distribution.

In a preferred embodiment, the plasmonic scattering nanomaterial comprises silver nanoparticles having a diameter in the range of 25-100 nm, preferably 50-100 nm, and a near electric field strength of 20-30 V/m, preferably 21-30 V/m, preferably 22-29 V/m, preferably 23-29 V/m, preferably 24-28 V/m, preferably 24-27 V/m when excited by light having a wavelength of 300-500 nm, preferably 325-450 nm, preferably 350-400 nm, or 375 nm.

In a preferred embodiment, the plasmonic scattering nanomaterial comprises silver nanoparticles having a diameter in the range of 100-300 nm, preferably 100-250 nm, preferably 100-200 nm and a near electric field strength of 5-10 V/m, preferably 5.5-9.5 V/m, preferably 6-9 V/m, preferably 6.5-9 V/m, preferably 7-9 V/m, preferably 7.5-9 V/m when excited by light having a wavelength of 300-500 nm, preferably 325-450 nm, preferably 350-400 nm, or 375 nm.

In a preferred embodiment, the plasmonic scattering nanomaterial comprises silver nanoparticles having a near electric field strength of 1-5 V/m, preferably 1-4.5 V/m, preferably 1-4 V/m, preferably 1.5-3.5 V/m, preferably 2-3 V/m when excited by light having a wavelength of 1000-1200 nm, preferably 1025-1175 nm, preferably 1050-1150 nm, preferably 1075-1125 nm, or 1100 nm.

In a preferred embodiment, the plasmonic scattering nanomaterial comprises silver nanoparticles having a diameter in the range of 25-100 nm, preferably 50-100 nm and an electric flux distribution of up to 40 nm, preferably up to 35 nm, preferably up to 30 nm, preferably up to 25 nm, preferably up to 20 nm when excited by light having a wavelength of 300-500 nm, preferably 325-450 nm, preferably 350-400 nm, or 375 nm and/or light having a wavelength of 1000-1200 nm, preferably 1025-1175 nm, preferably 1050-1150 nm, preferably 1075-1125 nm, or 1100 nm.

In a preferred embodiment, the plasmonic scattering nanomaterial comprises silver nanoparticles having a diameter in the range of 100-300 nm, preferably 100-250 nm, preferably 100-200 nm and an electric flux distribution of greater than 50 nm, preferably greater than 75 nm, preferably greater than 100 nm, preferably greater than 125 nm, preferably greater than 150 nm, preferably greater than 175 nm, preferably greater than 200 nm when excited by light having a wavelength of 300-500 nm, preferably 325-450 nm, preferably 350-400 nm, or 375 nm and/or light having a wavelength of 1000-1200 nm, preferably 1025-1175 nm, preferably 1050-1150 nm, preferably 1075-1125 nm, or 1100 nm.

According to a second aspect, the present disclosure relates to a method for producing the plasmonic scattering nanomaterial in any of its embodiments by a simple two-step process relying primarily on physical vapor deposition (PVD) methods. Physical vapor deposition methods describe a variety of vacuum deposition methods used to deposit thin films by the condensation of a vaporized form of the desired film material Onto various surfaces and/or substrates. The coating method involves purely physical processes such as high temperature vacuum evaporation with subsequent condensation, or plasma sputter bombardment rather than, involving a chemical reaction at the surface to be coated as in chemical vapor deposition. In a preferred embodiment, the plasmonic scattering material of the present disclosure in any of its embodiments is fabricated by physical vapor deposition methods, preferably sputter deposition.

Sputter deposition is a physical vapor deposition (PVD) method of thin film deposition by sputtering. This involves ejecting material from a "target" that is a source onto a "substrate" such as glass or a silicon wafer as described above. Resputtering refers to the re-emission of the deposited material during the deposition process by ion or atom bombardment. Sputtered atoms ejected from the target have a wide energy distribution, preferably greater than 5 eV, preferably greater than 10 eV, preferably greater than 20 eV, preferably greater than 30 eV, preferably greater than 40 eV, preferably greater than 50 eV. The sputtered ions (typically on the order of 1% of the ejected particles are ionized) fly from the target in straight lines and impact energetically on the substrates or vacuum chamber (causing resputtering). Alternatively, at higher gas pressures, the ions collide with the gas atoms that act as a moderator and move diffusively, reaching the substrates or vacuum chamber wall and condensing after undergoing a random deviation from a straight line.

The entire range from high energy ballistic impact to low energy thermalized motion is accessible by changing the background gas pressure. The sputtering gas is often an inert gas such as argon. For efficient momentum transfer, the atomic weight of the sputtering gas should be close to the atomic weight of the target, so for sputtering light elements neon is preferable, while for heavy elements krypton or xenon is preferable. Reactive gases can also be used to sputter compounds. The compound can be formed on the target surface, in-flight or on the substrate depending on the process parameters. The availability of many parameters that control sputter deposition make it a complex and tunable-process, but one that allows those trained in the art a large degree of control over the growth and microstructure of the film. In one embodiment the method of the present disclosure is viewed as easily adaptable to incorporate several sizes, shapes, and materials as substrates. In addition, the general shape of the substrate (i.e. flat, curved, conical, serpentine, bent, flexible) is viewed as non-limiting and its shape, dimensions, and physical properties may be extensively varied and contribute substantially to these values in the overall nanomaterial.

In a first step, metal oxide thin films are deposited on glass substrate via direct current (DC) sputtering techniques using an automatic sputter coater. Metal oxide thin films were deposited on substrate using reactive plasma of pure oxygen ($O_2$) and pore metal (i.e. zinc) target (greater than 90% pure target, preferably greater than 99%, preferably greater than 99.9%, preferably greater than 99.99%, preferably greater than 99.999% pure metal target). The deposition time is 5-60 minutes, preferably 10-50 minutes, preferably 15-40 minutes, preferably 20-30 minutes, preferably 25 minutes at up to 300 watt plasma power, preferably up to 250 watt plasma power, preferably up to 200 watt plasma power, preferably up to 150 watt plasma power, preferably up to 125 watt plasma power, preferably up to 100 watt plasma power. Subsequently, silver (Ag) is sputtered under pure argon (Ar) using a pure silver target (greater than 90% pure target, preferably greater than 99%, preferably greater than 99.9%, preferably greater than 99.99% pure silver target). The deposition time is less than 60 seconds, preferably less than 45 seconds, preferably less than 30 seconds, preferably less than 20 seconds, preferably less than 15 seconds or 10 seconds.

In one embodiment, the method and sputtering deposition technique may further comprise standard procedures to keep the targets clean and pure. The targets may be cleaned by a first round of ultrasonication for up to 60 minutes, preferably up to 45 minutes, preferably up to 30 minutes, preferably up to 15 minutes in a polar aprotic solvent (i.e. acetone) and the targets may be cleaned by a second round of ultrasonication for up to 60 minutes, preferably up to 45 minutes, preferably up to 30 minutes, preferably up to 15 minutes in a polar protic solvent (i.e. methanol). In one embodiment, the targets may be plasma etched for up to 10 minutes, preferably up to 5 minutes, preferably up to 4 minutes, preferably up to 3 minutes, preferably up to 2 minutes, preferably up to 1 minute before starting each deposition process.

The target substrate distance is preferably less than 50 cm, preferably less than 30 cm, preferably less than 20 cm, preferably less than 15 cm or 10 cm. The base pressure in the chamber is less than $10\times10^{-6}$ torr, preferably less than $5\times10^{-6}$ torr, preferably less than $4\times10^{-6}$ torr, preferably less than $3\times10^{-6}$ torr, preferably less than $2\times10^{-6}$ torr and the working pressure is set to $1\times10^{-3}$ to $10\times10^{-3}$ torr, preferably $2\times10^{-3}$ to $9.5\times10^{-3}$ torr, preferably $3\times10^{-3}$ to $9\times10^{-3}$ torr, preferably $4\times10^{-3}$ to $8.5\times10^{-3}$ torr, preferably $5\times10^{-3}$ to $8\times10^{-3}$ torr, preferably $6\times10^{-3}$ to $7.5\times10^{-3}$ torr or $7\times10^{-3}$ torr by adjusting the gas flow at 50-150 standard cubic centimeters per minute (SCCM), preferably 55-140 sccm, preferably 60-130 sccm, preferably 65-125 sccm, preferably 70-120 sccm, preferably 75-110 sccm, preferably 75-100 sccm, preferably 80-90 sccm (with pure $O_2$ for metal oxide deposition and Ar for silver deposition).

In a second step, the substrate, the metal oxide layer and the silver are annealed to form the plasmonic scattering nanomaterial wherein the silver nanoparticles are formed from the silver atop the metal oxide layer during the annealing. As used herein, "annealing" refers to a heat treatment that alters the physical and/or chemical properties of a material and generally involves heating the material to above its recrystallization temperature, maintaining a suitable temperature and then cooling. In a preferred embodiment, the annealing or heat treatment is performed in a tube furnace under a constant flow or argon (Ar). In one embodiment the silver nanoparticles may form and diffuse into substitutional positions in the crystal lattice of the metal oxide semiconductor layer during the annealing.

In a preferred embodiment, the heat treatment is performed at a temperature in the range of 150-750° C., preferably 175-725° C. preferably 200-700° C., preferably 300-650° C., preferably 350-625° C. preferably 400-600° C. and for a duration of up to 12 hours, preferably up to 10 hours, preferably up to 8 hours, preferably up to 6 hours, preferably up to 4 hours, preferably up to 3 hours, preferably up to 2 hours. In a preferred embodiment, the average silver nanoparticle size increase as the temperature at which the annealing is performed increases. For example, average particle sizes below 150 nm may be observed when the annealing is performed below 650° C. and average particle sizes above 150 nm may be observed when the annealing is performed above 650° C. In a preferred embodiment, the density of silver nanoparticles decreases as the temperature at which the annealing is performed increases. For example, the density of silver nanoparticles may be greater than $5.0\times10^8$ particles/cm$^2$ of the metal oxide layer when the annealing is performed below 650° C. and the density may be less than $1.0\times10^8$ particles/cm$^2$ of the metal oxide layer when the annealing is performed above 650° C.

In one embodiment, the method may further comprise a variety of techniques used to measure the physical properties of the physical vapor deposition coatings and films. Exemplary techniques include, but are not limited to, Calo testing (coating thickness test), nanoindentation (hardness test), pin on disc testing (wear and friction coefficient test), scratch testing (coating adhesion test), X-ray microanalysis testing (investigation of structural features and heterogeneity of elemental compositions for the growth surfaces).

In another embodiment, it is further envisaged that the method of the present disclosure is not particularly limiting and may be adapted to fabricate the plasmonic scattering nanomaterial in any of its embodiments by various techniques. Exemplary envisaged variants of physical vapor deposition that may be adapted for use in the present disclosure include, but are not limited to, cathodic arc deposition, electron beam physical vapor deposition, evaporative deposition, pulsed laser deposition, sputter deposition and mixtures thereof. Exemplary envisaged variants of sputter deposition that may be adapted for use in the present disclosure include, but are not limited to, ion beam sputtering, reactive sputtering, ion assisted deposition, high target utilization sputtering, high power impulse magnetron sputtering (HIPIMS), gas flow sputtering and mixtures thereof. In another embodiment, it is envisaged that the plasmonic scattering nanomaterial of the present disclosure may be fabricated from a variety of additional techniques including, but not limited to, chemical vapor deposition, ion implantation, wet chemistry, coating with silica, biogenic synthesis and mixtures thereof.

According to a third, aspect, the present disclosure relates to a thin film plasmonic solar cell comprising the plasmonic scattering nanomaterial in any of its embodiments. In a preferred embodiment, the plasmonically scattered light from the nanomaterial excites conduction electron of the substrate layer and metal oxide layer of the plasmonic scattering nanomaterial and increases absorption of a solar light source by the thin film plasmonic solar cell. Plasmonic solar cells are a class of photovoltaic devices that convert light into electricity by using plasmons. Plasmonic solar cells are a type of thin film solar cell that can use non limiting substrates which are cheaper than crystalline silicon (c-Si), such as glass, metals, plastics or steel as well as amorphous silicon (a-Si). The disadvantage of thin film solar cells is that they do not absorb as much light as thicker solar cells. The methods for trapping light are crucial in making thing film solar cells viable. Plasmonic cells improve absorption by scattering light using metal nanoparticles and the plasmonic scattering nanomaterial of the present disclosure excited at their surface plasmon resonance. This allows light to be absorbed more directly without the relatively thick additional layer and/or layers required in competing thicker types of solar cells.

One object of the present disclosure is to improve thin film solar cells by the use of metal nanoparticles distributed on the surface, increasing Raman scattering by at least an order of magnitude. The increased Raman scattering provides more photons to become available to excite surface plasmons which cause electrons to be excited and travel through the thin film solar cell to create a current. The design of plasmonic solar cells varies depending on the method being used to trap and scatter light across the surface and through the material. The nanoparticle cell described in the present disclosure and comprising the plasmonic scattering nanomaterial is designed to deposit metal nanoparticles on the top surface of a thin film solar cell. When light hits these metal nanoparticles at their surface plasmon resonance, the light is scattered in many different directions allowing light to travel along the solar cell and bounce between the substrate and the nanoparticles enabling the thin film plasmonic solar cell to absorb more light. The basic principles for the functioning of the plasmonic solar cell of the present disclosure include scattering and absorption of light due to the deposition of metal nanoparticles. Silicon does not absorb light very well. For this reason, more light needs to be scattered across the surface in order to increase the absorption.

It is envisioned that metal nanoparticles help to scatter the incoming solar light across the surface of the substrate (i.e. silicon). Surface plasmon resonance mainly depends on the density of free electrons in the particles. In order of density acceptable metals include, but are not limited to, aluminum (resonance under ultra violet light), silver (resonance under ultra violet light), gold (resonance under visible light), and copper (resonance under visible light) and mixtures thereof, preferably silver, in one embodiment, the dielectric constant for the embedding medium or semiconductor layer may be varied and the resonant frequency can be shifted. In addition, higher indexes of refraction will lead to a longer wavelength frequency. The surface plasmons are the excitations of the conduction electrons at the interface of metal nanoparticles and the dielectric. Metallic nanoparticles can be used to couple and trap freely propagating plane waves into the semiconductor metal oxide thin film layer. Light can be folded into the absorbing layer to increase the absorption. The localized surface plasmons in metal nanoparticles and the surface plasmon polaritons at the interface of the metal and semiconductor are crucial. The shape, size and dispersion of metal nanoparticles are factors determining the incoupling efficiency. Generally, smaller particles have larger incoupling efficiency due to enhanced near field coupling but larger ohmic losses in transferring that to the substrate. In one embodiment the thin film plasmonic solar cell of the present disclosure comprising the plasmonic nanoscattering material of the present disclosure can contain up to 95% of the light that enters it, preferably up to 90%, preferably up to 85%, preferably up to 80%, preferably up to 75%, preferably up to 70%, preferably up to 65%, preferably up to 60%, preferably up to 50%, preferably up to 40%, preferably up to 30% of the light that enters it.

Generally when a photon is excited in the substrate of a solar cell, an electron and hole are separated. Once the electrons and holes are separated, they will seek to recombine due to their opposite charges. If the electrons can be collected prior to this recombination they can be used as current for an external circuit. The design of the solar cell is a trade-off between minimizing this recombination (thinner layer) and absorbing more photons (thicker layer). Plasmonic solar cells are a type of thin film solar cell that typically are 1-2 μm thick. Thin film solar cell thickness varies from a few nanometers to tens of micrometers, but in each instance is much thinner then rival technology such as the conventional, first generation crystalline silicon (c-Si) solar cells that use wafers of up to 200 μm in thickness. In a preferred embodiment, the thin film, plasmonic solar cell of the present disclosure has an average thickness of less than 20 μm, preferably less than 15 μm, preferably less than 10 μm, preferably less than 5 μm, preferably less than 4 μm, preferably less than 3 μm, preferably less than 2 μm preferably less than 1 μm. The average thickness may vary from these ranges and still provide an acceptable thin film plasmonic solar cell comprising the plasmonic scattering nanomaterial.

The metal nanoparticles are deposited at a distance from the substrate to trap light between the substrate and the particles. In one embodiment, the metal nanoparticles may be deposited on top of the substrate or embedded in the substrate. In another embodiment, the metal nanoparticles may be deposited in top of and/or embedded in a dielectric material on top of the substrate (i.e. the metal oxide layer, silicon or silicon nitride). Typically, the amount of light radiated into the substrate decreases with distance from the substrate; however, if there is no distance between the substrate and the nanoparticles no light is trapped and more light escapes. In one embodiment, the thin film plasmonic solar cell comprising the plasmonic scattering nanomaterial of the present disclosure has an absorption depth profile referring to local ranges of enhanced and broadened substrate absorbance in the substrate layer of up to 2.0 μm, preferably up to 1.5 μm, preferably up to 1.25 μm, preferably up to 1.2 μm, preferably up to 1.1 μm, preferably up to 1.0 μm, preferably up to 0.9 μm, preferably up to 0.8 μm, preferably up to 0.7 μm, preferably up to 0.6 μm, preferably up to 0.5 μm.

Solar cell efficiency is the ratio of the electrical output of a solar cell to the incident energy in the form of sunlight. The energy conversion efficiency (η) of a solar cell is the percentage of the solar energy to which the cell is exposed that is converted into electrical energy. This is calculated by dividing a cell's power output (in watts) at its maximum power point ($P_m$) by the irradiance or input light (G in W/m$^2$) and the surface area of the solar cell ($A_c$ in m$^2$) and is given by formula I:

$$\eta = \frac{P_m}{G \times A_c} \quad (I)$$

In one embodiment, the thin film plasmonic solar cell comprising the plasmonic scattering nanomaterial of the present disclosure has a solar cell efficiency in terms of energy conversion efficiency (η) of at least 10%, preferably at least 11%, preferably at least 12%, preferably at least 13%, preferably at least 15%, preferably at least 16%, preferably at least 17%, preferably at least 18%, preferably at least 19%, preferably at least 20%, preferably at least 25%, preferably at least 30%. By convention, solar cell efficiencies are measured under standard test conditions unless stated otherwise. Standard test conditions specify a temperature of 25° C. and an irradiance (G) of 1000 W/m$^2$ with an air mass 1.5 spectrum. In another embodiment, several factors may affect a cell's conversion efficiency value and be evaluated including, but not limited to, its reflectance efficiency, thermodynamic efficiency, charge carrier separation efficiency, and conduction efficiency values. As a result of difficulty in measuring these parameters directly, other parameters may be measured instead including, but not limited to, quantum efficiency, $V_{oc}$ ratio, and fill factor values.

In one embodiment, the thin film plasmonic solar cell of the present disclosure may further comprise layers and coatings for affecting the light absorption, exciton generation and/or electric current processing of the thin film plasmonic solar cell including, but not limited to, a transparent conducting coating or layer, an antireflective coating or layer, additional n-type "window" layers formed by a first semiconductor material, additional p-type "absorber" layers formed by a second semiconductor material (i.e. copper, indium, gallium, selenide or cadmium telluride) additional junctions formed between two semiconductor materials of opposite n-type and p-type, one or more substrates, one or more ohmic contacts and mixtures thereof.

The examples below are intended to further illustrate protocols for preparing and characterizing the plasmonic scattering nanomaterial of the present disclosure. Further, they are intended to illustrate assessing the properties of these nanomaterials. They are not intended to limit the scope of the claims.

Example 1

Preparation and Characterization of the Plasmonic Scattering Nanomaterial

Figure 2:
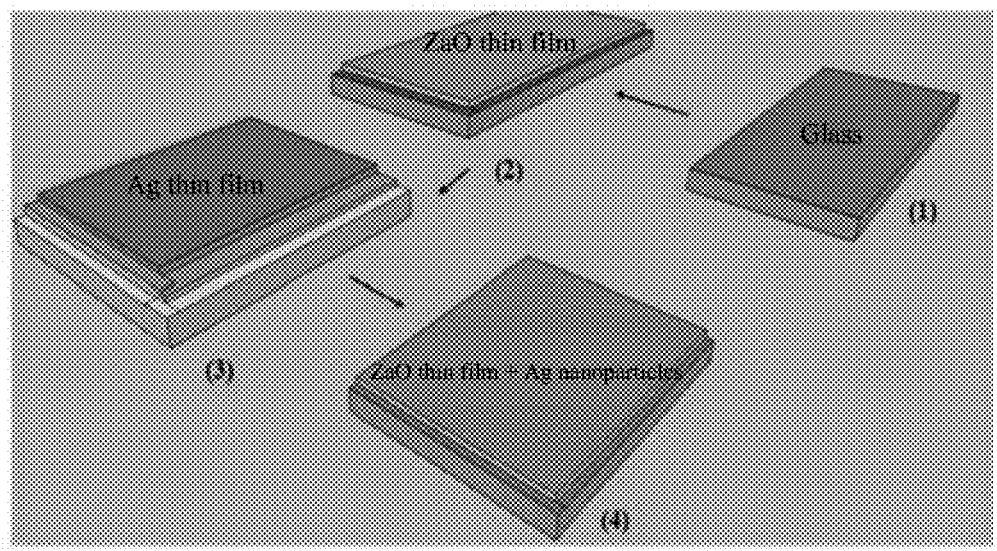
FIG. 2 is a schematic diagram of the two-step process adopted herein to fabricate silver (Ag) nanoparticles on a zinc oxide (ZnO) thin film.

Silver (Ag) nanoparticles on zinc oxide (ZnO) were fabricated in a simple two-step process: (i) sputtering of an ultrathin Ag layer on a ZnO thin film and (ii) subsequent heat treatment under a constant flow of argon (Ar). A schematic is shown in FIG. 2 wherein the process starts with glass substrate to ZnO and Ag sputtering to heat treatment. Thin layers of metallic silver were obtained by a direct current (DC) sputtering technique using an automatic sputter coater (model NSC-4000).

The deposition Ag—ZnO layers was carried out in two steps. First, ZnO thin films were deposited on a glass substrate using reactive plasma of pure oxygen ($O_2$) and pure zinc target (zinc target 99.999% received from Semiconductor wafer, Inc.). The deposition time was maintained at ~25 minutes at 100 watt plasma power. In the second step, Ag was sputtered under pure argon (Ar) using a pure silver target (silver target 99.99% received from Semiconductor wafer, Inc.) with a deposition time of ~10 seconds. Standard procedures were maintained to keep the targets neat and clean. The targets were ultrasonicated for 15 min in acetone followed by 15 min ultrasonic cleaning in methanol. The targets were plasma etched for 1 minute before starting each deposition process. The target substrate distance was maintained fixed at 10 cm. The base pressure in the chamber was less than less than $2\times10^{-6}$ torr and the working pressure was set to $7\times10^{-3}$ torr by adjusting the gas flow at 80 sccm (pure $O_2$ for ZnO deposition and Ar for silver deposition). The samples were annealed in a tube furnace (OTF-1200X from MTI Corp.) at different temperatures ranging from 200° C. to 700° C. under a constant flow of Ar atmosphere.

Figure 3A:
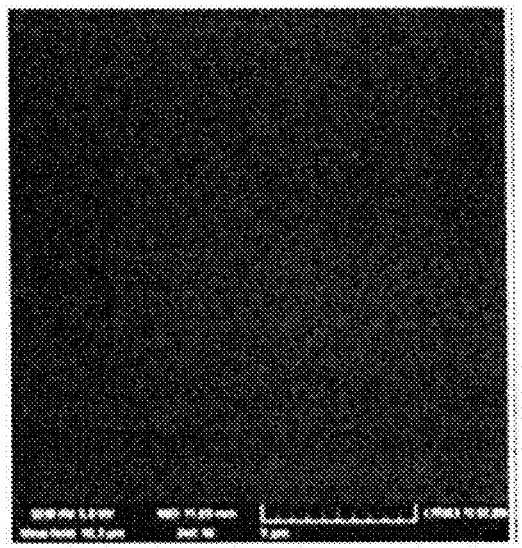
FIG. 3A is a field emission scanning electron microscopy (FESEM) micrograph image following step one in the process, sputtering of the ultrathin Ag layer on the ZnO thin film.
Figure 3B:
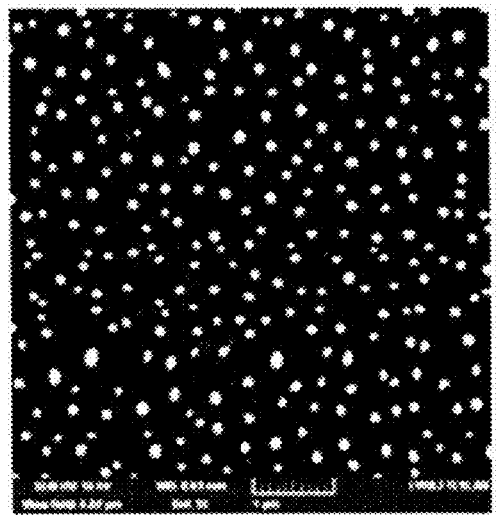
FIG. 3B is a FESEM micrograph image following step two in the process, subsequent heat treatment under a constant flow of Ar.
Figure 4A:
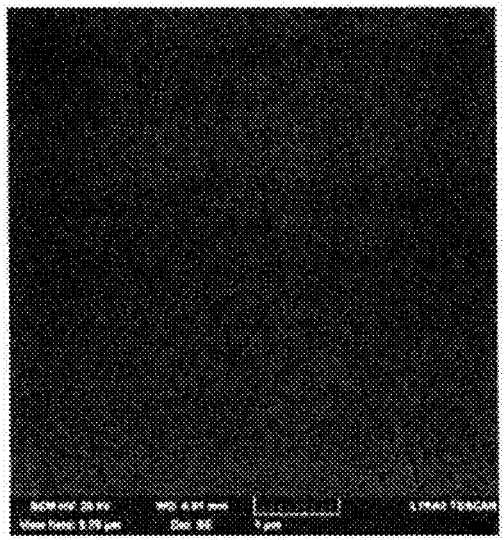
FIG. 4A is a FESEM micrograph image of silver nanoparticles on ZnO after heat treatment for 4 hours in an argon atmosphere at a temperature of 200° C.
Figure 4B:
FIG. 4B is a FESEM micrograph image of silver nanoparticles on ZnO after heat treatment for 4 hours in an argon atmosphere at a temperature of 400° C.
Figure 4C:
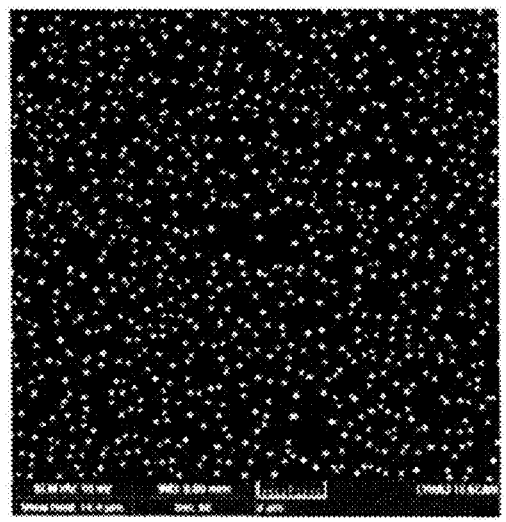
FIG. 4C is a FESEM micrograph image of silver nanoparticles on ZnO after heat treatment for 4 hours in an argon atmosphere at a temperature of 600° C.
Figure 4D:
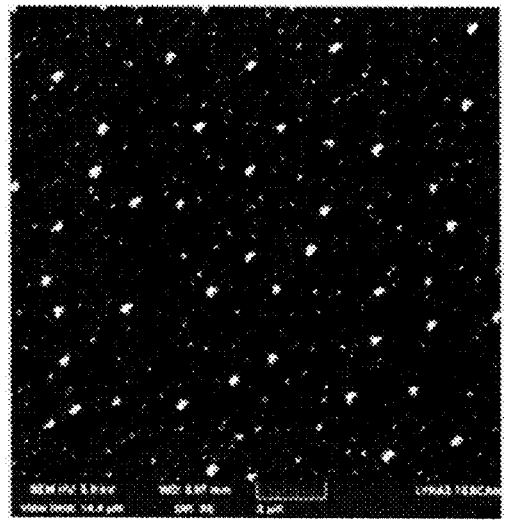
FIG. 4D is a FESEM micrograph image of silver nanoparticles on ZnO after heat treatment for 4 hours in an argon atmosphere at a temperature of 700'° C.

Field emission scanning electron microscope (FESEM) (FEI Nova-Nano SEM-600) was used to confirm the morphology and size distribution of Ag nanoparticles. Elemental analysis is also done by FESEM-aided energy dispersive X-ray (EDX) spectroscopy. Sputtering of the Ag layer showed a relatively smooth surface topology as shown in the SEM image of FIG. 3A with reference to a clear and visible formation of silver nanoparticles after the treatment as shown in FIG. 3B. It is important to understand the evolution of silver nanoparticles from ultrathin Ag layer on ZnO. A systemic approach was taken to observe the sequence of silver nanoparticle formation on the ZnO thin film. The ultrathin layer of Ag on ZnO was treated at specific temperature for 4 hours in Ar atmosphere and the morphology was investigated by FESEM. It was revealed that at 200° C. the Ag film remained as it is shown in FIG. 3A and FIG. 4A. The nucleation was found to start at an annealing temperature of 400° C. and the average nanoparticle size increased with increasing annealing temperatures as shown in FIG. 4B, FIG. 4C, and FIG. 4D. In addition, the density of nanoparticles was observed to decrease from ~$7.5\times10^8$ particles/cm$^2$ (at 600° C.) to ~$3.125\times10^7$ particles/cm$^2$ (at 700° C.) in addition to a broad size distribution.

Figure 5A:
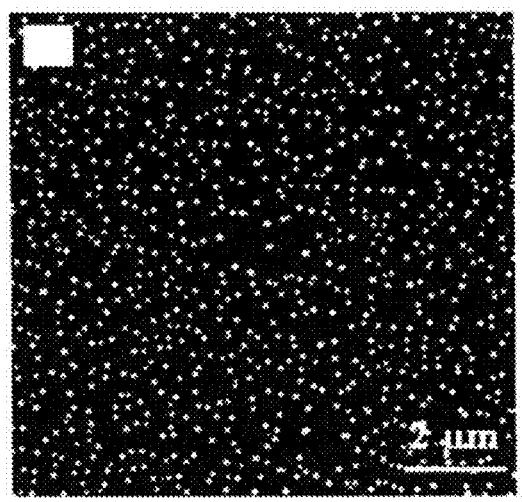
FIG. 5A is a FESEM micrograph image of the as fabricated silver nanoparticles.
Figure 5B:
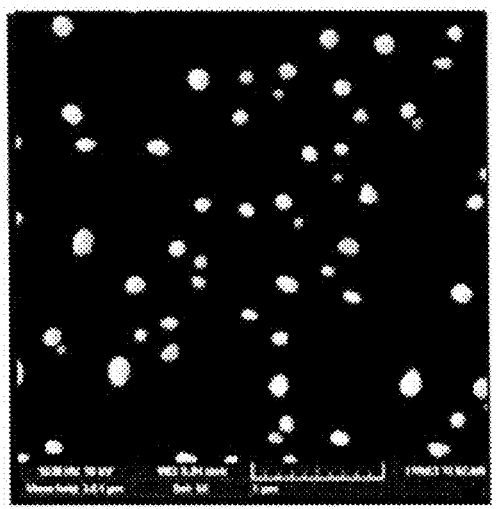
FIG. 5B is a FESEM micrograph image of the magnified view of the as fabricated silver nanoparticles.

A periodic observation at specific temperature intervals confirmed the formation of Ag nanoparticles as well as their particle size distribution. FIG. 5A shows a field emission scanning electron microscope (FESEM) micrograph of Ag nanoparticles as fabricated at a suitable post deposition annealing carried out at 600° C. for two hours in the tube furnace. A wider size distribution was observed with particle size ranging from 50 nm to 200 nm in diameter. The coverage of the Ag nanoparticles was found to be sufficient and $13.88\times10^8$ particles/cm$^2$. As per the calculation and simulation shown above, such nanoparticles possess the additional benefit of increased scattering cross section and widened flux distribution compared to that of a narrow size distribution and close packed and/or well-ordered nanoparticles. A magnified FESEM image (FIG. 5B) indicates further that the particles are not perfectly spherical and uniform in size distribution.

Figure 6A:
FIG. 6A is a FESEM micrograph image of the ZnO thin film without the ultrathin Ag layer before heat treatment.
Figure 6B:
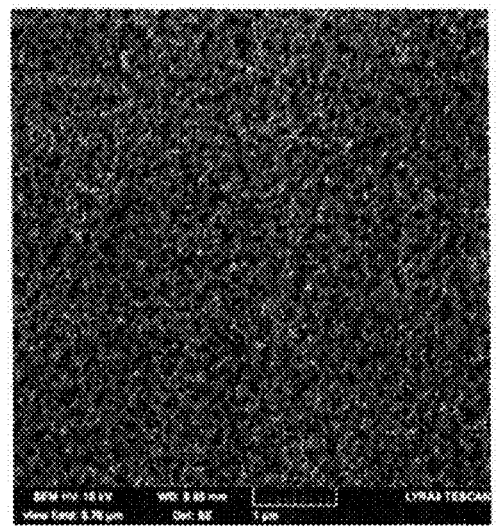
FIG. 6B is a FESEM micrograph image of the ZnO thin film without the ultrathin Ag layer after heat treatment.

Since the ZnO thin film is always present under the ultrathin Ag layer, it was apparent that this underneath layer would also go through the same treatment during the course of fabricating silver nanoparticles. Thus, an additional investigation was carried out to observe the characteristics of the ZnO thin film with and without the ultrathin Ag layer. FESEM micrographs of the ZnO thin film without the Ag ultrathin layer confirmed that the surface topography became rough after the heat treatment in addition to the formation of some noticeable small pores. FIG. 6A and FIG. 6B show the SEM images of the ZnO thin film without the ultrathin Ag layer before and after the treatment respectively. X-ray diffraction of such specimens also confirmed the directional growth of ZnO and grain growth after the treatment. The ZnO thin film with ultrathin Ag layer also showed that the optical band gap decreases from 3.31 eV to 3.24 eV with increasing annealing temperature. The detailed measurements and interpretation is out of context and explained elsewhere [Q. A. Drmosh, M. K. Hossain, F. H. Harbi and N. Tabet, 'Morphological structural and optical properties of silver treated zinc oxide thin film', J Mater Sci: Mater Election (2015) 26:139-148—each incorporated herein by reference in its entirety].

Figure 7A:
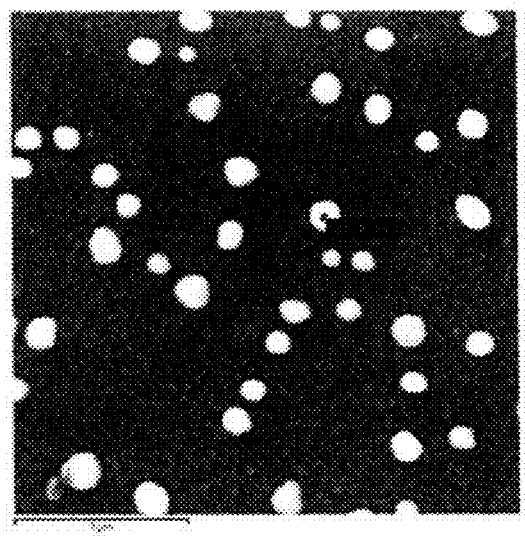
FIG. 7A is a FESEM micrograph image of the sliver nanoparticles on ZnO used for the FESEM-EDX analysis
Figure 7B:
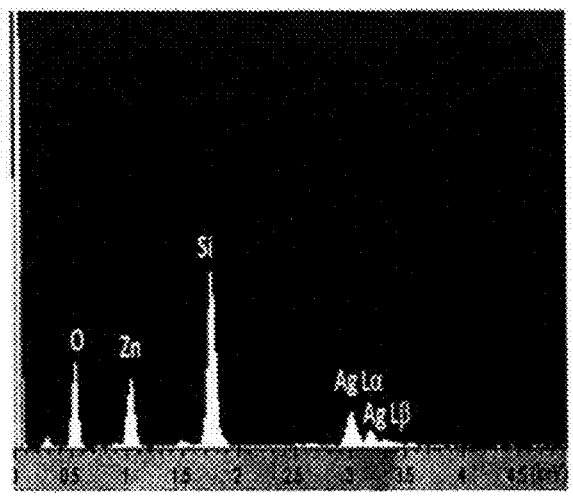
FIG. 7B is an energy dispersive X-ray (EDX) spectrum of the as fabricated silver nanoparticles on ZnO thin layer.

Nanoparticles are preferably very pure and ligand/surfactant free for photovoltaic applications to avoid trapping of excitons. Keeping this challenge in mind, Ag nanoparticles were fabricated through a physical route without the presence of any molecules or surfactants. Here, a simple two-step process was adopted to fabricate Ag nanoparticles on ZnO thin films as described above. Briefly, a ZnO thin film was sputtered on a standard glass substrate followed by further sputtering of an ultra-thin Ag layer. Subsequently, the specimen was treated at high temperature in inert environment (e.g. argon/nitrogen). The elemental analysis of the as fabricated silver nanoparticles on ZnO thin film was carried out by FESEM-aided EDX. FIG. 7A shows the FESEM micrograph of silver nanoparticles on ZnO used for SEM0EDX analysis. As shown in FIG. 7B, the peaks for Zn, O and Si were obvious in addition to Ag $L_\alpha$ and Ag $L_\beta$ peaks at 2.98 keV and 3.15 keV respectively. The positions of the Ag peaks coincide with the FESEM database as well as the values reported previously [S. Dengler, C. Kübel, A. Schwenke, G. Ritt, B. Eberle, Near- and off-resonant optical limiting properties of gold-silver alloy nanoparticles for intense nanosecond laser pulses, *J. Opt.* 14:075203-075210, 2012.—incorporated herein by reference in its entirety].

Example 2

Absorption and Scattering Analysis of the Plasmonic Scattering Nanomaterial

Figure 8:
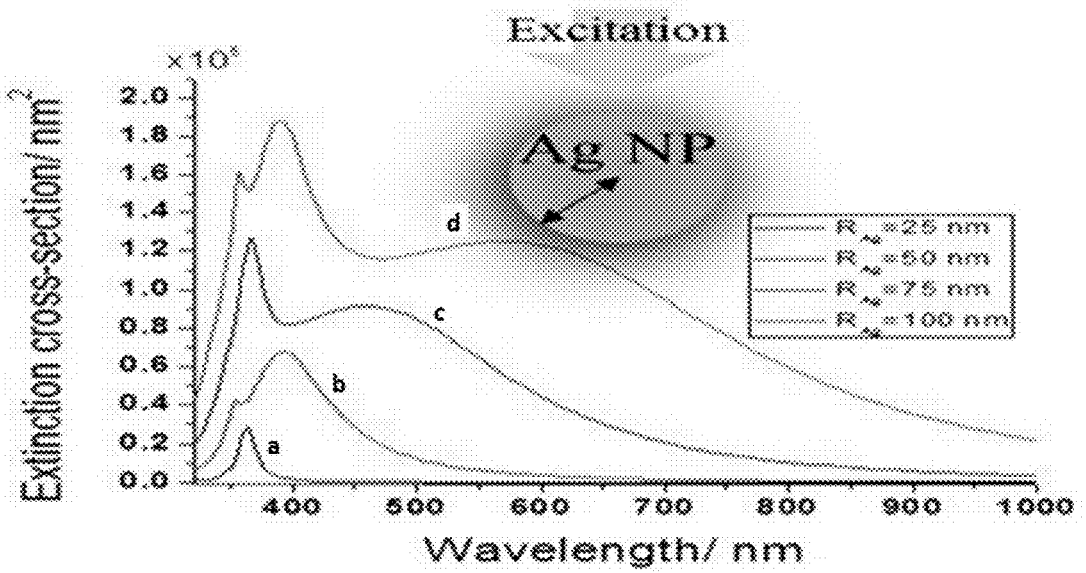
FIG. 8 is the Mie scattering for an extinction cross section of silver (Ag) nanoparticles having a diameter of (a) 50 nm, (b) 100 nm, (c) 150 nm and (d) 200 nm.

A wide range of nanoparticle morphologies and sizes were used to optimize near electric field distribution, electric flux and absorption depth profile. The larger silver nanoparticles are envisioned to have strong absorption in addition to a wider scattering cross-section at longer wavelengths. Mie scattering describes the scattering of an electromagnetic plane wave by a homogeneous sphere. Mie scattering of single silver nanoparticles having diameters of 50 nm, 100 nm, 150 nm, and 200 nm was carried out. FESEM morphology confirmed that the size distribution of the as fabricated Ag nanoparticles was between 50 and 200 nm in diameter. Therefore, 50 nm, 100 nm, 150 nm and 250 nm in diameter were considered for calculation and simulation to understand the scattering and electric flux variation. FIG. 8 shows extinction spectra of a single silver nanoparticle of 50 nm, 100 nm, 150 nm, and 200 nm diameters. Since extinction cross section is the sum of absorption and scattering cross section, the sharp peaks near the shorter wavelength (~375 nm) and broad peaks near the longer wavelengths as observed in FIG. 8 represent absorption and scattering respectively. It is apparent that the cross section increases with increasing particle sizes. The scattering cross section is broadened with increasing particle sizes as indicated in the calculations.

In view of photovoltaics, the active layer responsible for exciton generation is most important. The more excitons available or generated, the more efficient the solar cell is. If the solar radiation is absorbed by other layers or elements, the active layer will receive less radiation and thus the probability of exciton generation will decrease. On the other hand, if any object or element increases the scattering of fee radiation that will lead to higher absorption by the active layer and thus the probability of exciton generation will increase. There is little to no increase in exciton generation in the active layer for higher absorption by the nanoparticles (e.g. that of 50 nm in FIG. 8). In such a scenario, radiation is absorbed by scatters and therefore a strong EM field is induced within a small area (~1 nm or less) as explained in the FDTD simulation described below. Although an increase in electron-hole pair generation is achieved, it is limited to the volume of the active layer that is within a few tens of nm or even less, whereas the cell as a whole has considerably larger dimensions in both laterally and in depth. For higher scattering of nanoparticles (e.g. that of 200 nm in FIG. 8), the scenario is much improved. Here a strong forward scattering of incident radiation at wavelengths near and somewhat longer than the surface plasmon polariton resonance wavelength is achieved resulting in an increased electric flux for a considerable distance (i.e. a micron or more). Such observations are explained by numerical analysis as well as FDTD simulations.

It is noteworthy that the absorption peak (~375 nm for Ag nanoparticles) is far below the photon needed for the active layer to generate excitons suitable for photovoltaics (e.g. 1107 nm for a-Si:H). Thus out of the entire solar spectrum, a photon of 375 nm (which is usually unused for Si-based solar cells) induces absorption due to Ag nanoparticles, whereas a photon of 1107 nm is completely utilized simultaneously for the generation of excitons. Increased scattering cross section due to Ag nanoparticles in longer wavelength in fact is favorable for exciton generation in the active layer. A typical model of Ag nanoparticles dispersed on a Si layer was carried out and explained below.

Example 3

Finite Different Time Domain (FDTD) Analysis of the Prepared Plasmonic Scattering Nanomaterial Since the absorption peak for the silver nanoparticles was observed at around 375 nm and that of amorphous silicon (a-Si) at around 1107 nm, finite different time domain (FDTD) simulations were focused on these two excitations only. Near field distribution and electric flux around the particles were also calculated. Based on the calculation and prediction, an attempt was taken to understand the feasibility of as fabricated Ag nanoparticles on a ZnO thing layer.

Combining, the calculation and the average size of the as fabricated silver nanoparticles, a simulation by FDTD was carried out to demonstrate the near electric field distribution of single silver (Ag) nanoparticles. Two sizes of nanoparticles, such as, 50 nm and 200 nm in diameter, were considered to understand the trend of electric flux distribution. Silver nanoparticles have an absorption peak near 375 nm as seen in FIG. 8, whereas Si based active layers have a band gap of around 1107 nm. Thus, it is important to FIG. out how particles are generating electric flux distribution at different excitations. The parameters were chosen such that it can be explained with reference to the calculation as well as the as fabricated Ag nanoparticles.

Figure 9A:
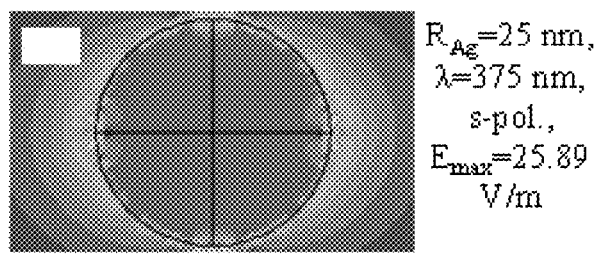
FIG. 9A is a near field distribution for a silver nanoparticle having a 50 nm diameter at 375 nm excitation with s-polarization.
Figure 9B:
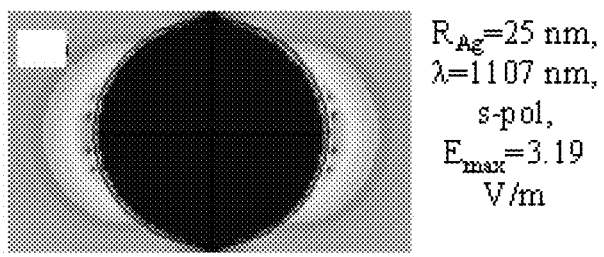
FIG. 9B is a near field distribution for a silver anoparticle having a 200 nm diameter at 375 nm excitation with s-polarization.
Figure 9C:
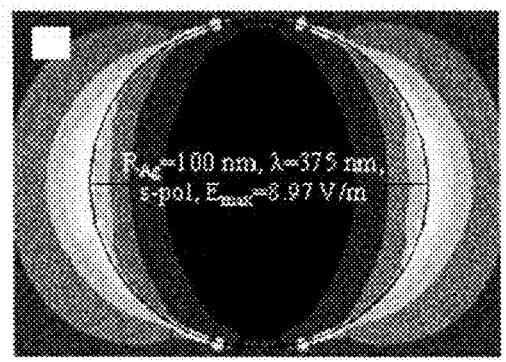
FIG. 9C is near field distribution for a silver nanoparticle having a 50 nm diameter at 1107 nm excitation with s-polarization.
Figure 9D:
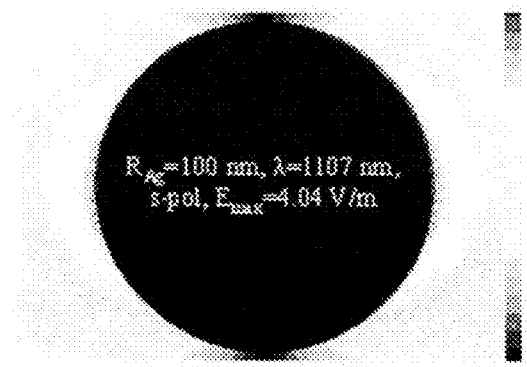
FIG. 9D is near field distribution for a silver nanoparticle having a 200 nm diameter at 1107 nm excitation with s-polarization.
Figure 10A:
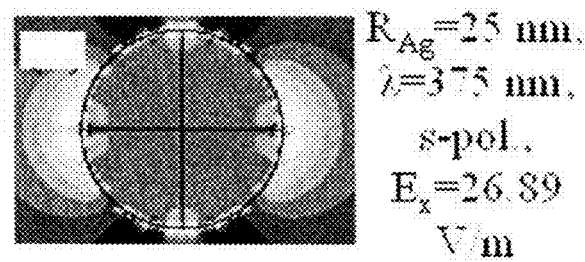
FIG. 10A is an individual x-component near field distribution for a silver nanoparticle having a 50 nm diameter at 375 nm excitation with s-polarization.
Figure 10B:
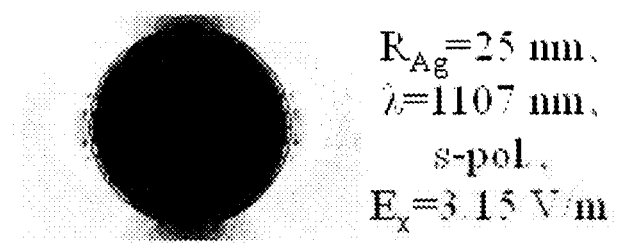
FIG. 10B is an individual x-component near field distribution for a silver nanoparticle having a 50 nm diameter at 1107 nm excitation with s-polarization.
Figure 10C:
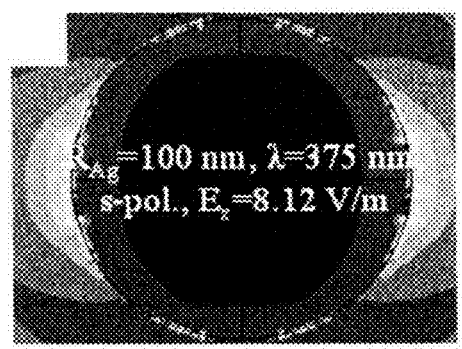
FIG. 10C is an individual x-component near field distribution for a silver nanoparticle having a 200 nm diameter at 375 nm excitation with s-polarization.
Figure 10D:
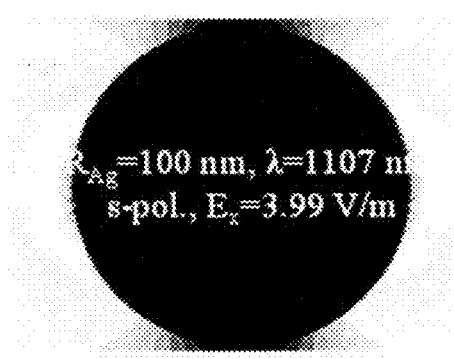
FIG. 10D is an individual x-component near field distribution for a silver nanoparticle having a 200 nm diameter at 1107 nm excitation with s-polarization.
Figure 10E:
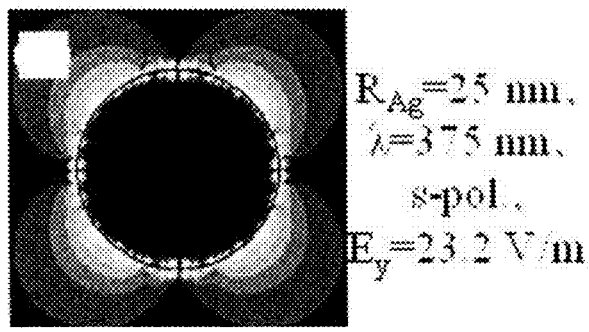
FIG. 10E is an individual y-component near field distribution for a silver nanoparticle having a 50 nm diameter at 375 nm excitation with s-polarization.
Figure 10F:
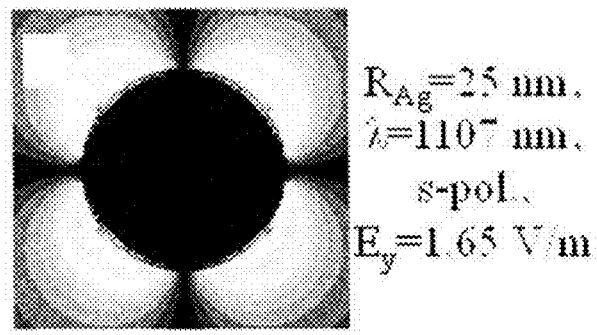
FIG. 10F is an individual y-component near field distribution for a silver nanoparticle having a 5.0 nm diameter at 1107 nm excitation with s-polarization.
Figure 10G:
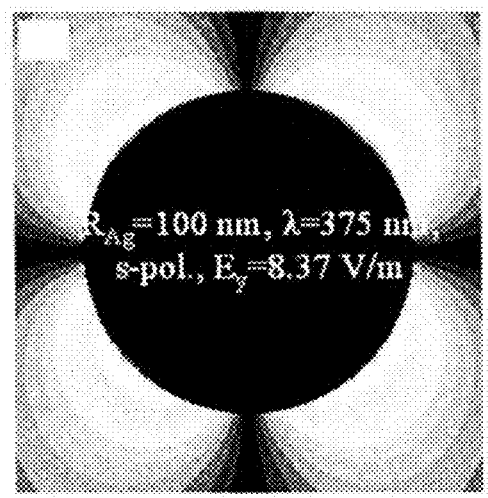
FIG. 10G is an individual y-component near field distribution for a silver nanoparticle having a 200 nm diameter at 375 nm excitation with s-polarization.
Figure 10H:
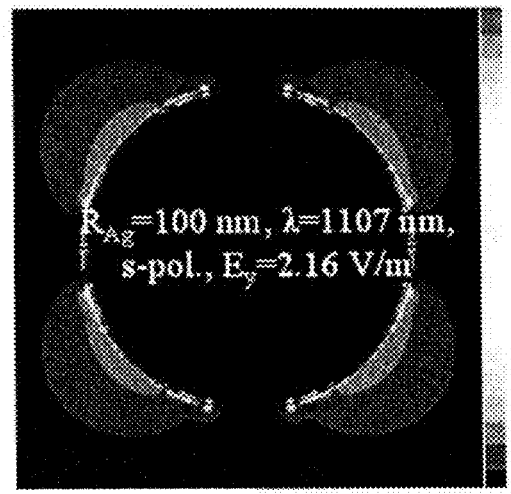
FIG. 10H is an individual y-component near field distribution for a silver nanoparticle having a 200 nm diameter at 1107 nm excitation with s-polarization.

FIG. 9A, FIG. 9B, FIG. 9C and FIG. 9D show the 3D FDTD simulated near electric field distributions of single silver nanoparticles of various sizes and excitations. The parameters are noted within the figure. It was observed that smaller particles (50 nm in diameter) get induced with higher electric flux with limited distribution surrounding the particles (e.g. ~20 nm) at higher energy of radiation as shown in FIG. 9A and FIG. 9B. It is clear because of their absorption peak near that region. Larger nanoparticles were observed having a higher electric flux distribution surrounding the particles (e.g. ~50 nm) as shown in FIG. 9C and FIG. 9D. The phenomena are also reflected in FIG. 8. The nanoparticles are embedded into the active layer similar to floating objects in a confined box. Thus, the interaction between the photon and the nanoparticles is reduced relative to the three dimensional affect to the surrounding medium (i.e. the active layer).

Individual component analysis of the electric field distribution is shown in FIG. 10A, FIG. 10B, FIG. 10C, FIG. 10D, FIG. 10E, FIG. 10F, FIG. 10G and FIG. 10H. FIG. 10A, FIG. 10B, FIG. 10C, FIG. 10D, FIG. 10E, FIG. 10F, FIG. 10G and FIG. 10H show x- and y-components of a near electric field distribution of a single silver nanoparticle having diameters of 50 nm and 200 nm along with individual parameters used in the simulation. The x-component (FIG. 10A, FIG. 10B, FIG. 10C, and FIG. 10D) of electric flux distribution showed a similar trend with reference to that explained above for FIG. 9A, FIG. 9B, FIG. 9C and FIG. 9D. For the y-component (FIG. 10E, FIG. 10F, FIG. 10G and FIG. 10H), it was observed that 20-25 nm of the surrounding material (i.e. the active layer) was influenced in four directions in the case of smaller nanoparticles, whereas more than 100 nm of surrounding material was influenced for larger particles.

Example 4

Absorption Depth Profile Analysis of the Prepared Plasmonic Scattering Nanomaterial Strong optical scattering associated with metal nanoparticles is one of the keys to engineering photon propagation into and within a solid state semiconductor device, such as a plasmonic solar cell. Until recently studies have focused on the increase of absorption in silicon (Si) based solar cells through the surface plasmon effect. It possesses at least three ways to contribute to the solar cell: (i) a subwavelength scattering element to trap free plane waves into absorption layers, (iii) as surface plasmon polaritons modes to confine and guide the light in absorption layers and (iii) as a nanoantenna to store incident energy efficiently in absorbing layers. Finite different time domain (FDTD) is a convenient technique to analyze and predict inherent characteristics of any such system. A typical model of Ag nanoparticles dispersed on Si was considered to understand the trend of absorption depth profile induced inside the substrate by FDTD simulation.

Figure 11:
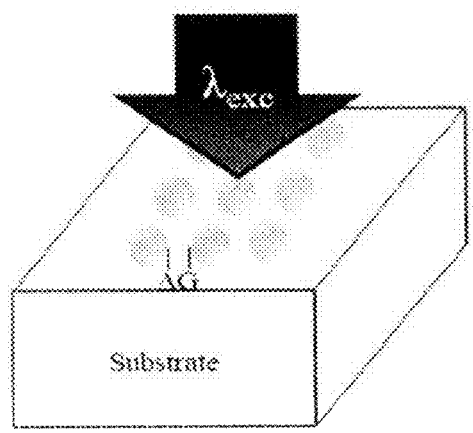
FIG. 11 is schematic diagram of the simulated model for the absorption profile of silver nanoparticles on silicon (Si) substrate system of different sizes of silver nanoparticles at different excitations and different interparticle distances.

Considering the benefit of as fabricated silver nanoparticles a typical model was used to understand the trend of absorption depth profile as can be seen in FIG. 11, FIG. 12A, FIG. 12B, FIG. 12C, FIG. 12D, FIG. 12E, and FIG. 12F. The model consisted of silver nanoparticles of 100 nm in diameter dispersed ion a silicon substrate of more than a micron (μm) in depth. The interparticle distance was varied from 100 to 275 to 450 nm. A free-hand schematic of the model, is shown in FIG. 11. Since the absorption, peak of silver nanoparticles are known to be around 400 nm and that of silicon around 1100 nm, the absorption depth profiles were kept limited to these excitations only. A tabulated representation of absorption depth profiles for such conditions are shown in FIG. 12A, FIG. 12B, FIG. 12C, FIG. 12D, FIG. 12E, and FIG. 12F (Table 1). It is noteworthy that the absorption is significantly enhanced and broadened in the silicon layer due to the presence of silver nanoparticles only when the system is excited at 400 nm (i.e. near the absorption band of silver nanoparticles).

TABLE 1

Absorption profile of silver nanoparticles on Si substrate system at different excitations and interparticle distances

Figure 12A:
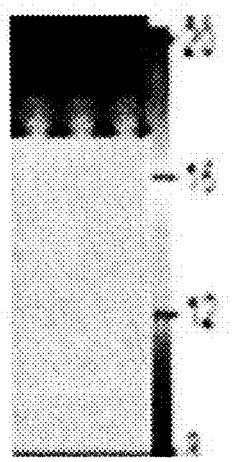
FIG. 12A is an absorption profile of silver nanoparticles on Si substrate system at an excitation of 1100 nm and an interparticle distance of 0 nm.
Figure 12B:
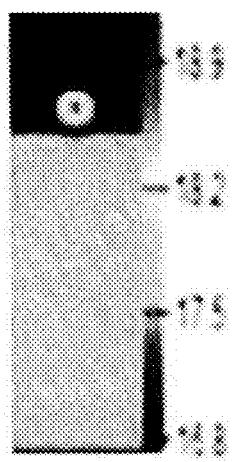
FIG. 12B is an absorption profile of silver nanoparticles on Si substrate system at an excitation of 1100 nm and an interparticle distance of 175 nm.
Figure 12C:
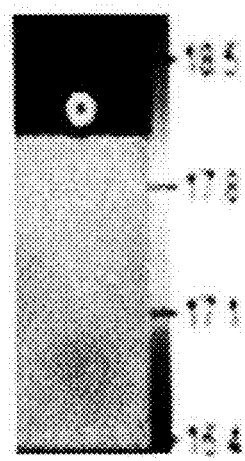
FIG. 12C is an absorption profile of silver nanoparticles on Si substrate system at an excitation of 1100 nm and an interparticle distance of 350 nm.
Figure 12D:
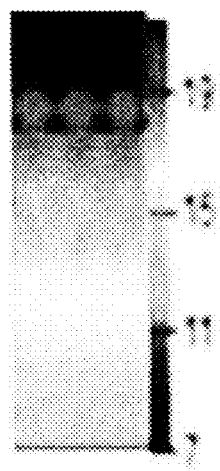
FIG. 12D is an absorption profile of silver nanoparticles on Si substrate system at an excitation of 400 nm and an interparticle distance of 0 nm.
Figure 12E:
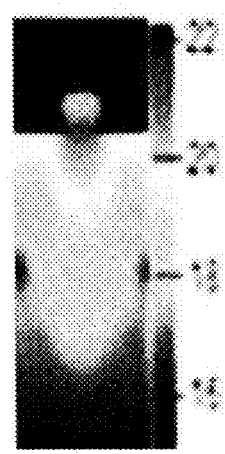
FIG. 12E is an absorption profile of silver nanoparticles on Si substrate system at an excitation of 400 nm and an interparticle distance of 175 nm.
Figure 12F:
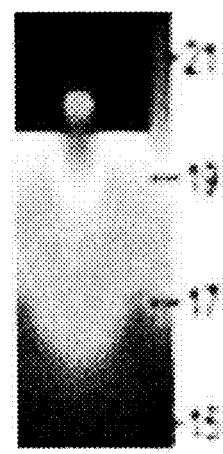
FIG. 12F is an absorption profile of silver nanoparticles on Si substrate system at an excitation of 400 nm and an interparticle distance of 350 nm.
Figure 13A:
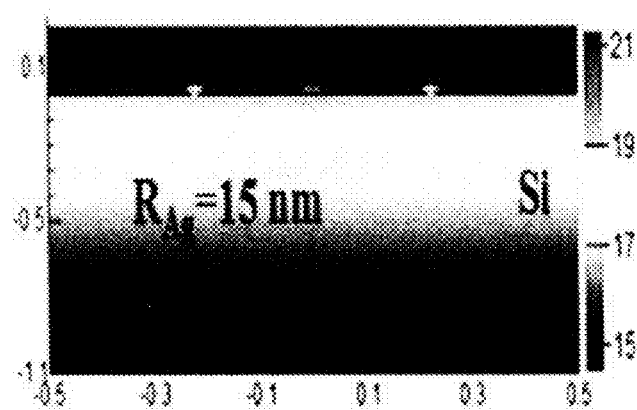
FIG. 13A is an absorption profile of silver nanoparticles having a diameter of 30 nm dispersed on Si substrate system at an excitation of400 nm.
Figure 13B:
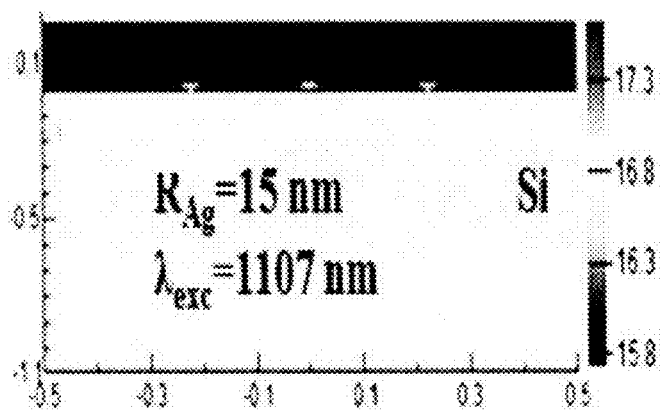
FIG. 13B is an absorption profile of silver nanoparticles having a diameter of 30 nm dispersed on Si substrate system at an excitation of 1107 nm.
Figure 13C:
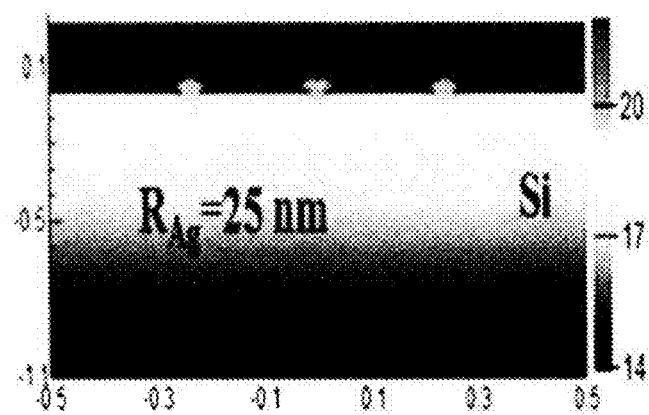
FIG. 13C is an absorption profile of silver nanoparticles having a diameter of 50 nm dispersed on Si substrate system at an excitation of 400 nm.
Figure 13D:
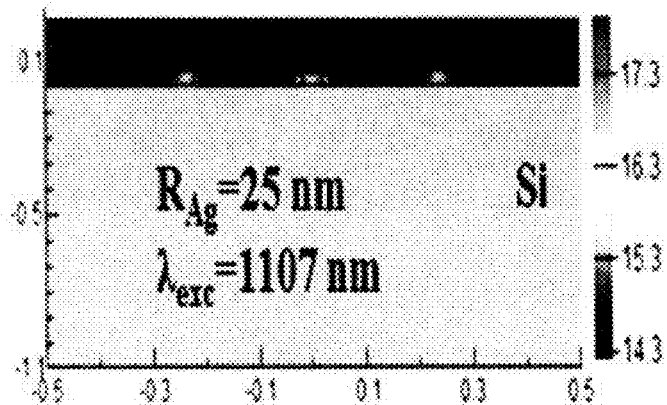
FIG. 13D is an absorption profile of silver nanoparticles having a diameter of 50 nm dispersed on Si substrate system at an excitation of 1107 nm.
Figure 13E:
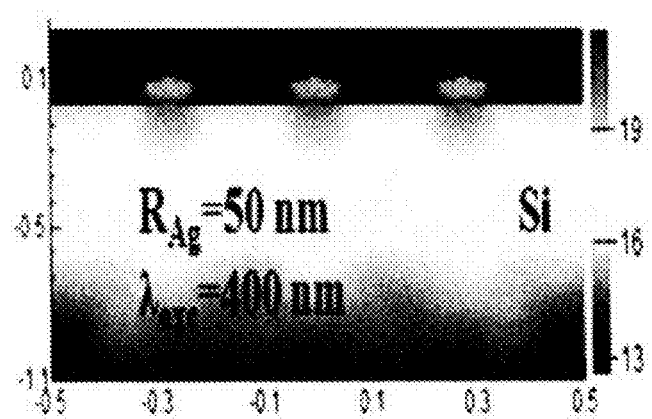
FIG. 13E is an absorption profile of silver nanoparticles having a diameter of 100 nm dispersed on Si substrate system at an excitation of 400 nm.
Figure 13F:
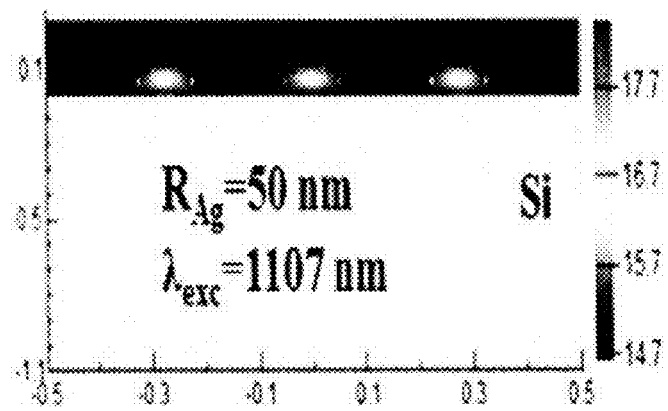
FIG. 13F is an absorption profile of silver nanoparticles having a diameter of 100 nm dispersed on Si substrate system at an excitation of 1107 nm.
Figure 14:
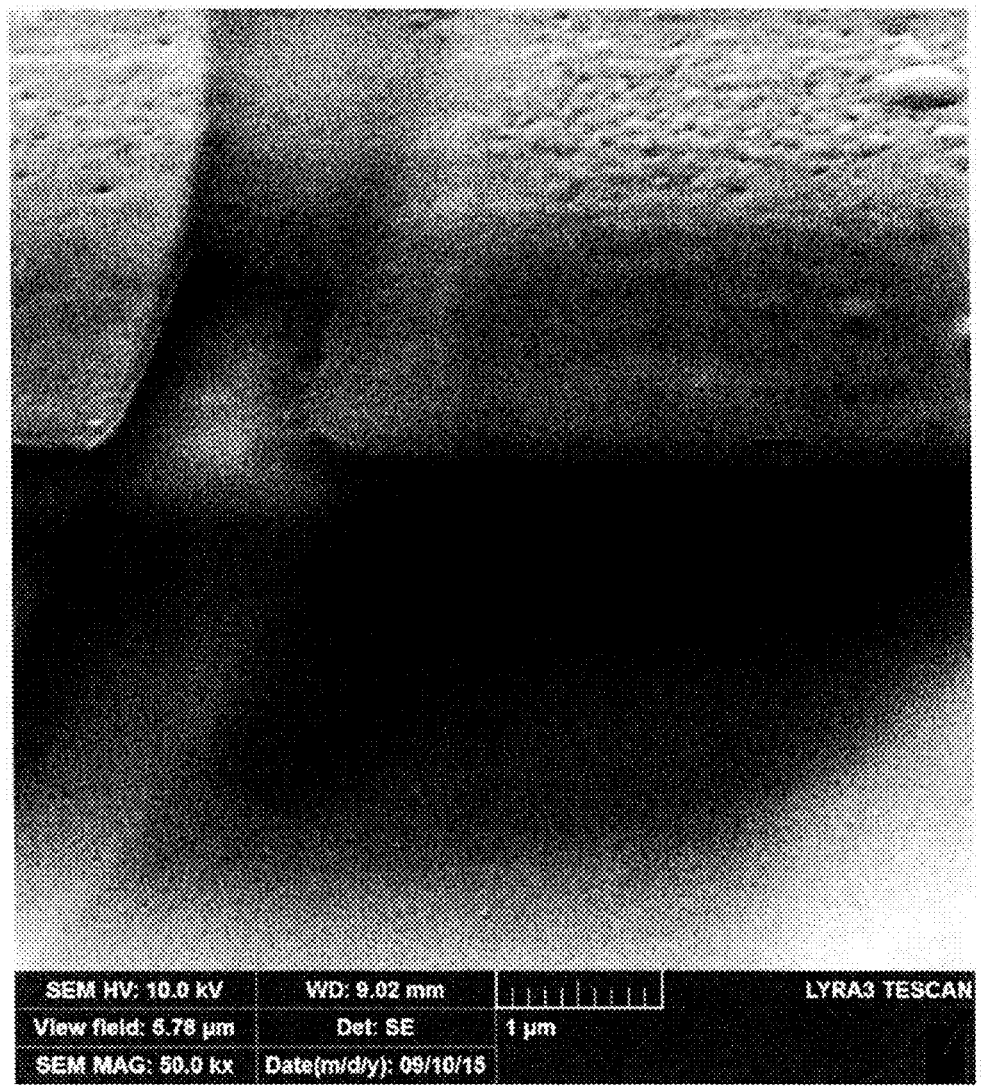
FIG. 14 is a FESEM micrograph image of the ZnO thin film layer.
Figure 15:
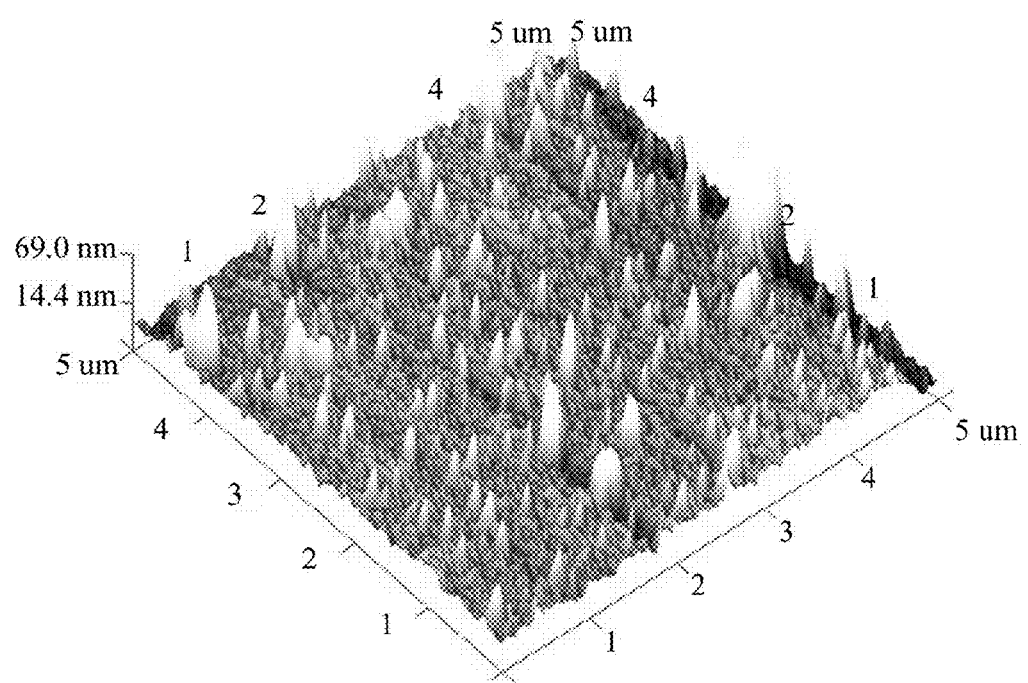
FIG. 15 is an atomic force microscopy (AFM) image of the ZnO thin film layer.

| Excitation ($\lambda_{exc}$) | Interparticle Distance ($\Delta G$) | Entry |
| --- | --- | --- |
| 1100 nm | 0 nm | FIG. 12A |
| 1100 nm | 175 nm | FIG. 12B |
| 1100 nm | 350 nm | FIG. 12C |
| 400 nm | 0 nm | FIG. 12D |
| 400 nm | 175 nm | FIG. 12E |
| 400 nm | 350 nm | FIG. 12F |

Considering the benefit of as fabricated Ag nanoparticles, such as isolated and broad size distribution, a typical model was used to understand the trends of absorption depth profile as shown in FIG. 13A, FIG. 13B, FIG. 13C, FIG. 13D, FIG. 13E and FIG. 13F. The model consisted of Ag nanoparticles having a diameter of 30, 50 and 100 nm dispersed on a silicon substrate of more than a micron (μm) of depth. The center to center distance for modeled nanoparticles was kept constant at 275 nm so that nanoparticles are far enough apart to be free from plasmon coupling. Based on the simulation and the argument mentioned above, the adsorption depth profiles were studied at 400 and 1107 nm excitations only. A tabulated representation of absorption depth profiles for such conditions are shown in FIG. 13A, FIG. 13B, FIG. 13C, FIG. 13D, FIG. 13E and FIG. 13F. It is noteworthy that the absorption is significantly enhanced and broadened in the silicon layer due to the presence of Ag nanoparticles only while the system is excited at 400 nm (i.e. near the absorption band of Ag nanoparticles). The absorption cross section was found to be enhanced for larger nanoparticle sizes as well.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A thin film plasmonic solar cell, comprising:
a substrate layer;
a metal oxide layer in continuous contact with the substrate layer;
silver nanoparticles with a diameter of 25-300 nm deposited on the metal oxide layer;
a transparent coating covering the metal oxide layer on which the silver nanoparticles are deposited; and
wherein greater than 30% of a surface area of the metal oxide layer is covered with the silver nanoparticles;
wherein the silver nanoparticles plasmonically scatter light throughout the metal oxide layer when excited by light having a wavelength in the range of 300-500 nm or 1000-1200 nm; and
wherein the silver nanoparticles have a near electric field strength of 1-30 V/m when excited by light having a wavelength in the range of 300-500 nm or 1000-1200 nm.

2. The thin film plasmonic solar cell of claim 1, wherein the metal oxide layer is zinc oxide.

3. The thin film plasmonic solar cell of claim 1, wherein the substrate layer is glass.

4. The thin film plasmonic solar cell of claim 1, which comprises $2.0 \times 10^7$ to $2.0 \times 10^9$ silver nanoparticles per $cm^2$ of the metal oxide layer.

5. The thin film plasmonic solar cell of claim 1, wherein the silver nanoparticles have an average center to center distance of greater than 100 nm.

6. The thin film plasmonic solar cell of claim 1, wherein the silver nanoparticles have a broad particle size distribution having a relative standard deviation of greater than 5%.

7. The thin film plasmonic solar cell of claim 1, wherein the silver nanoparticles have a diameter in the range of about 25-100 nm and a near electric field strength of 20-30 V/m when excited by light having a wavelength of 300-500 nm.

8. The thin film plasmonic solar cell of claim 1, wherein the silver nanoparticles have a diameter in the range of about 100-300) nm and a near electric field strength of 5-10 V/m when excited by light having a wavelength of 300-500 nm.

9. The thin film plasmonic solar cell of claim 1, wherein the silver nanoparticles have a diameter in the range of about 100-300 nm and have an electric flux distribution of greater than 50 nm when excited by light having a wavelength of 300-500 nm or 1000-1200 nm.

10. The thin film plasmonic solar cell of claim 1, further comprising nanoparticles comprising at least one additional plasmonic metal selected from the group consisting of gold, copper, aluminum, platinum, and palladium and alloys thereof.

11. The thin film plasmonic solar cell of claim 1, which is substantially free of surfactants, ligands, capping reagents, binders and/or linkers.

12. The thin film plasmonic solar cell of claim 1;
wherein the thin film plasmonic solar cell has an average thickness of less than 20 μm; and
wherein the plasmonically scattered light excites conduction electrons of the substrate layer and metal oxide layer and increases absorption of solar light by the thin film plasmonic solar cell.

13. The thin film plasmonic solar cell of claim 12, wherein the thin film plasmonic solar cell has an absorption depth profile of up to 2 μm.

14. The thin film plasmonic solar cell of claim 12, which has a solar cell efficiency (q) of at least 10%.

15. The thin film plasmonic solar cell of claim 1, wherein greater than 35% of a surface area of the metal oxide layer is covered with the silver nanoparticles.

16. The thin film plasmonic solar cell of claim 1, wherein greater than 35% of a surface area of the metal oxide layer is covered with the silver nanoparticles, and wherein the metal oxide layer consists of zinc oxide.

* * * * *